US012740390B2

(12) United States Patent
Sun et al.

(10) Patent No.: US 12,740,390 B2
(45) Date of Patent: Sep. 15, 2026

(54) STACKED INTEGRATED CIRCUIT DEVICES WITH FACE-TO-FACE CONNECTIONS BETWEEN LOGIC AND MEMORY DIES

(71) Applicant: QUALCOMM Incorporated, San Diego, CA (US)

(72) Inventors: Yangyang Sun, San Diego, CA (US); Yue Li, San Diego, CA (US); Lily Zhao, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 361 days.

(21) Appl. No.: 18/428,092

(22) Filed: Jan. 31, 2024

(65) Prior Publication Data

US 2025/0246569 A1 Jul. 31, 2025

(51) Int. Cl.

*H10W 20/20* (2026.01)
*H10W 72/00* (2026.01)
*H10W 90/00* (2026.01)

(52) U.S. Cl.

CPC .......... *H10W 20/20* (2026.01); *H10W 90/00* (2026.01); *H10W 72/859* (2026.01); *H10W 90/722* (2026.01); *H10W 90/754* (2026.01)

(58) Field of Classification Search

CPC ... H10W 20/20; H10W 90/00; H10W 72/859; H10W 90/722; H10W 90/754; H10W 72/823; H10W 90/20; H10W 90/297; H10W 90/724; H10W 72/50; H10W 72/20; H10W 90/701; H10W 74/10

See application file for complete search history.

(56) References Cited

U.S. PATENT DOCUMENTS 8,466,543 B2 * 6/2013 Fleischman .......... H10W 90/00 257/777
9,379,090 B1 * 6/2016 Syed .......... H10P 72/74
11,476,200 B2 * 10/2022 Shih .......... H10W 70/614
11,495,574 B2 * 11/2022 Choi .......... H10W 70/614
2011/0291261 A1 * 12/2011 Fleischman .......... H10W 90/00 257/737
2015/0303174 A1 * 10/2015 Yu .......... H10W 90/00 438/109
2021/0050326 A1 * 2/2021 Choi .......... H10W 70/614
2022/0045012 A1 * 2/2022 Shih .......... H10W 70/614
2023/0207475 A1 * 6/2023 Brun .......... H10W 70/614 257/666
2025/0316554 A1 * 10/2025 Chen .......... H10W 40/22
2025/0336685 A1 * 10/2025 Juang .......... H10W 70/095

OTHER PUBLICATIONS

International Search Report and Written Opinion—PCT/US2025/010880—ISA/EPO—Jun. 6, 2025.
Partial International Search Report—PCT/US2025/010880—ISA/EPO—Apr. 11, 2025.

* cited by examiner

*Primary Examiner* — J. E. Schoenholtz
(74) *Attorney, Agent, or Firm* — Moore IP

(57) ABSTRACT

A stacked IC device includes a first memory die and a second memory die coupled to the substrate. The stacked IC device also includes a logic die electrically connected, face-to-face, to the first memory die and the second memory die and electrically connected to the substrate by conductors that extend through a region between the first memory die and the second memory die.

18 Claims, 13 Drawing Sheets

STACKED INTEGRATED CIRCUIT DEVICES WITH FACE-TO-FACE CONNECTIONS BETWEEN LOGIC AND MEMORY DIES

FIELD

Various features relate to stacked integrated circuit devices with face-to-face connections between logic and memory dies.

BACKGROUND

Electrical connections exist at each level of a system hierarchy of an integrated circuit (IC) device. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. Recently, the number of interconnect levels for circuitry has substantially increased due to the large number of devices that are now interconnected in a modern electronic device. The increased number of interconnect levels for supporting the increased number of devices involves more intricate manufacturing processes.

During the design of modern integrated circuit devices, there is often a conflict between various design goals. For example, in some applications, it is desirable to limit IC package size and it is desirable to improve heat dissipation. However, generally, smaller IC packages have less area for removal of heat. Thus, reducing IC package size can tend to reduce heat dissipation. Similar conflicts can arise between heat dissipation and processing performance because higher performance processors tend to generate more heat. Further, the goal of reducing cost can conflict with almost any other improvement goal. Thus, it is challenging to provide high performance IC devices that can meet the various design goals. These challenges are especially significant for mobile applications where power constraints, device size, processing performance, heat dissipation, cost, and many other factors come into play simultaneously.

SUMMARY

Various features relate to IC devices.

One example provides a stacked IC device that includes a first memory die coupled to a substrate and a second memory die coupled to the substrate. The stacked IC device also includes a logic die electrically connected, face-to-face, to the first memory die and the second memory die and electrically connected to the substrate by conductors that extend through a region between the first memory die and the second memory die.

Another example provides a stacked IC device that includes a first memory die coupled to a substrate, and a second memory die coupled to the substrate. The stacked IC device also includes a first logic die electrically connected, face-to-face, to the first memory die, and a second logic die electrically connected, face-to-face, to the second memory die. The stacked IC device further includes conductors extending through a region between the first memory die and the second memory die and electrically connecting the first logic die and the second logic die to the substrate.

Another example provides a method for fabricating a stacked IC device that includes attaching a first memory die to a substrate and attaching a second memory die to the substrate. The method also includes electrically connecting a logic die to the substrate, the first memory die, and the second memory die such that the logic die is oriented face-to-face with the first memory die and the second memory die and conductors that electrically connect the logic die to the substrate extend through a region between the first memory die and the second memory die.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates an exemplary sequence for fabricating an example of a patch component.

FIG. 13 illustrates an exemplary sequence for fabricating another example of a patch component.

DETAILED DESCRIPTION

Figure 1A:
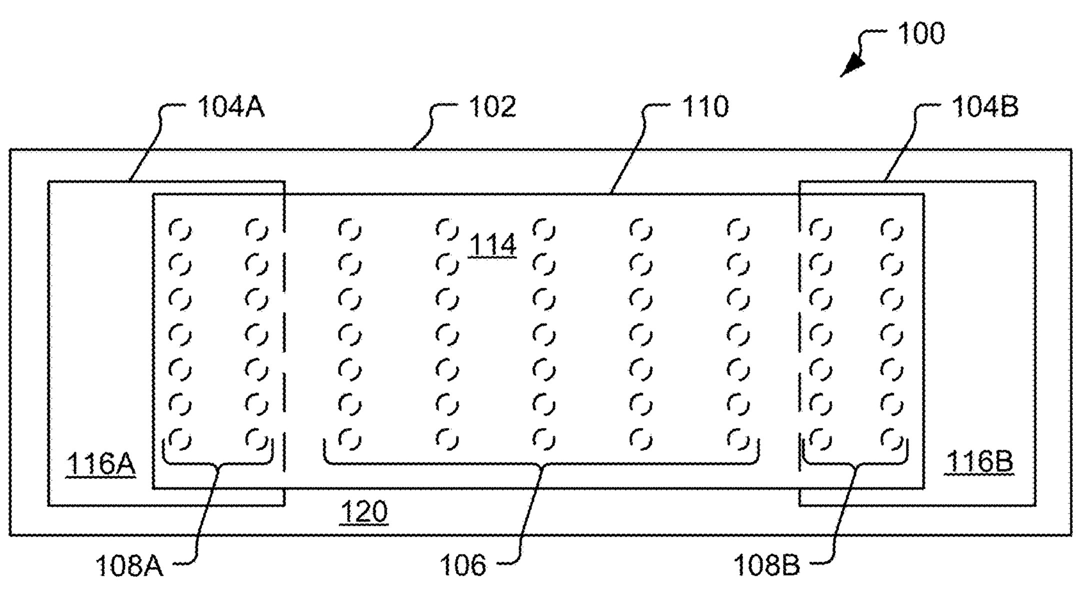
FIG. 1A illustrates a schematic top view of an example of an exemplary stacked IC device.

Particular aspects of the disclosure describe stacked integrated circuit (IC) devices and methods of fabrication that use face-to-face configurations to electrically connect one or more logic dies to memory devices. The logic dies can include a single logic die or several logic dies configured to work independently or in conjunction with one another. For example, the logic dies can include chiplets configured to interact with one another to perform various operations. In the disclosed examples, the logic die(s) are electrically connected face-to-face with the memory dies and are electrically connected to a substrate by conductors that extend through a region between two of the memory dies. The face-to-face electrical connections between the logic die(s) and the memory dies provides short interconnect paths which improves the data rate of memory access as compared to configurations in which logic and memory dies are interconnected by less direct routes, such as side-by-side configurations and package-on-package configurations. One problem associated with coupling logic and memory dies face-to-face is how to route other connections of the logic dies (e.g., connections power and other input/output (I/O) connections). Examples disclosed herein solve this problem by routing many (or all) of these other connections of the logic die through conductors that extend through a region between two of the memory dies.

In the context of this disclosure, a "face" of a die refers to a surface of the die adjacent to an active region of the die. For example, the active region can include various layers and structures that define circuit elements, such as transistors, conductors, passive circuit elements (e.g., resistors, inductors, capacitors, etc.), and a power delivery network. In this example, the face of the die corresponds to the side of the die that bounds the active region. In contrast, a "back" of the die refers to an opposite side of the die which bounds an inactive region of the die. For example, the inactive region typically includes undoped monocrystalline semiconductive material, other inactive layers (e.g., passivation layers), or both.

As used herein, the term "stacked" (as in "stacked dies" and/or "stacked ICs") refer to arrangements in which one die or device (e.g., a first die) is disposed over, including directly over or partially over, another die or device (e.g., a second die). As used herein, a "face-to-face" refers to a stacked die arrangement in which a first die and a second die are stacked such that a normal of the face of the first die is antiparallel to a normal of the face of the second die. Put another way, the face of the first die is toward the face of the second die, and the backs of the first and second dies are oriented away from one another.

Electrically connecting a face of a memory device to a face of a logic package in a face-to-face configuration enables the use of short, high-density (e.g., small pitch) interconnections between the memory device and the logic package. Shorter interconnections are generally subject to less resistive loss, resulting in improved power efficiency and less heat generation. Additionally, shorter interconnections enable faster signal exchange than longer interconnections.

In some implementations, the conductors that electrically connect a logic die to the substrate include tall conductive posts (e.g., copper posts) formed on the logic die. In other implementations, the conductors are disposed in a body of a patch component. For example, the body of the patch component can include silicon, and the conductors can include through silicon vias (TSVs). As another example, the body can include a polymer (e.g., one or more resin, prepreg, or mold compound layers), and the conductors can be disposed in or through the polymer. In some implementations, the patch component includes other features in addition to the conductors. For example, the patch component can include traces to form conductive paths between the logic die and other components (e.g., one or more other logic dies). As another example, the patch component can include passive circuit elements, such as capacitors, inductors, and/or resistors.

As compared to conventional approaches, such as side-by-side or package-on-package configurations, the face-to-face arrangement of logic and memory dies disclosed herein enables low-cost fabrication of IC devices that have a small form factor, high-density logic-memory interconnection, high-speed logic-memory communication, improved thermal management, improved power distribution network performance, as well as other benefits. For example, since the thickness of the logic die(s) used in the disclosed embodiments does not result in longer conductive paths, the logic die(s) can have thick inactive regions to facilitate heat transfer, resulting in improved thermal management. As another example, the face-to-face electrical connections can reduce reliance on horizontal connections and/or redistribution layers, which reduces manufacturing cost and can reduce losses due to shortened end-to-end conductive path length.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1A, multiple memory dies are illustrated and associated with reference numbers 104A and 104B. When referring to a particular one of these memory dies, such as memory die 104A, the distinguishing letter "A" is used. However, when referring to any arbitrary one of these memory dies or to these memory dies as a group, the reference number 104 is used without a distinguishing letter.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in state-of-the-art applications, such as in ICs for mobile devices.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming more common as significant power performance area (PPA) yield enhancements are demonstrated for stacked die and chiplet architecture product lines. Forming an IC device using stacked dies, chiplets, or both, can provide various benefits as compared to providing the same functional circuitry in one monolithic chip. For example, each chiplet is smaller than a single monolithic die that includes all of the same functional circuit blocks. Since yield loss, and costs due to yield loss, in IC manufacturing tends to increase as the die size increases, using smaller dies can reduce yield loss (i.e., increase yield) of the IC manufacturing process. Another benefit is that the chiplets can be fabricated in different locations and/or by different manufacturers, and in some cases, using different fabrication technologies (e.g., different fabrication technology nodes). As an example, one die of a chiplet-based integrated device can include components (e.g., interconnects, transistors, etc.) that have a first minimum size, and another die of the chiplet-based integrated device can include components (e.g., interconnects, transistors, etc.) that have a second minimum size, where the second minimum size is greater than the first minimum size. In contrast, all of the circuitry of a monolithic die is fabricated using the same fabrication technologies and equipment. As a result, when manufacturing a monolithic die, the entire die may be subject to the tightest manufacturing constraint of the most complex component of the monolithic die. In contrast, when using chiplets, different chiplets can be manufactured using different fabrication technologies (e.g., different fabrication technology nodes), and only the chiplet or chiplets that include the most complex components are subjected to the tightest manufacturing constraints. In this arrangement, chiplets fabricated using less expensive and/or higher yield fabrication technologies can be integrated with chiplets fabricated using more expensive and/or lower yield fabrication technologies to form an IC (e.g., the stacked IC device), resulting in overall savings. Still further, in some cases, as technology improves, the design of a chiplet can be changed. New chiplet designs may be used in conjunction with older chiplet designs to form IC devices, which improves manufacturing flexibility and reduces design costs.

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture. As used herein, the term "die" can include a chiplet or a monolithic IC. For example, a logic die can be configured to operate independently of other logic dies (e.g., as a monolithic IC). Alternatively, the logic die can include a first set of functional logic blocks that are configured to operate in conjunction with functional logic blocks of one or more other logic dies (e.g., in a chiplet architecture).

A three-dimensional (3D) integrated circuit (3D IC) includes a set of stacked and interconnected dies. Generally, a 3D IC architecture can achieve higher performance, increased functionality, lower power consumption, and/or smaller footprint, as compared to providing the same circuitry in a monolithic die or in a two-dimensional (2D) IC structure.

Exemplary Stacked IC Device

Figure 1B:
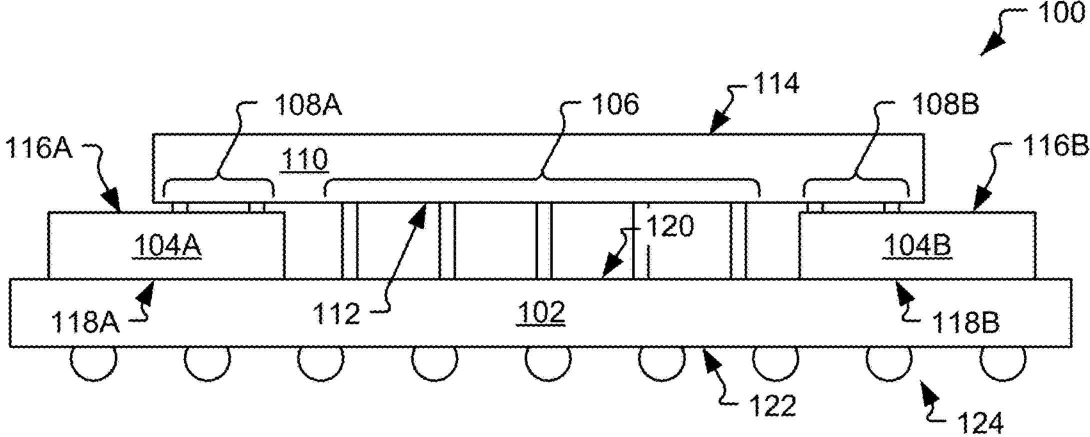
FIG. 1B illustrates a schematic elevational view of an example of the exemplary stacked IC device of FIG. 1A.
Figure 1C:
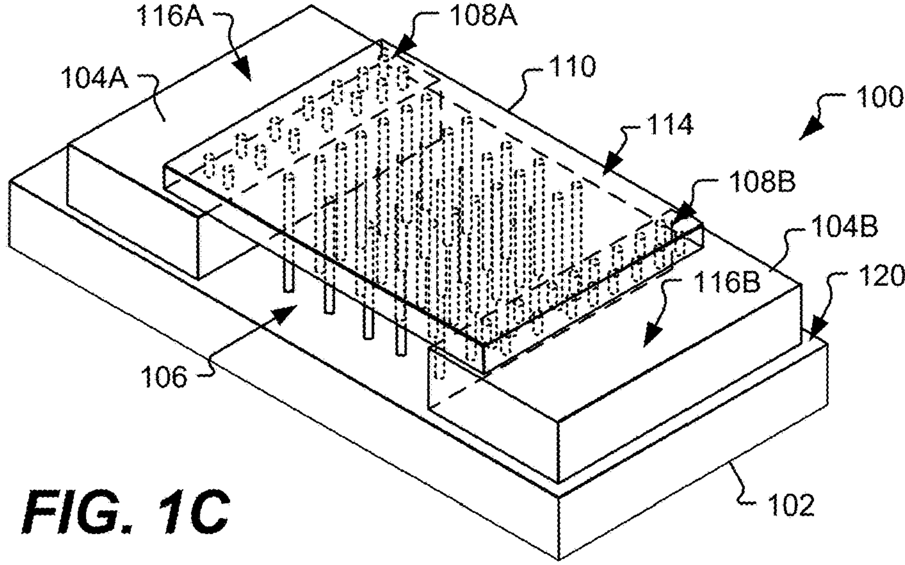
FIG. 1C illustrates a schematic perspective view of an example of the exemplary stacked IC device of FIG. 1A.

FIGS. 1A, 1B, and 1C illustrate schematic top, elevational, and perspective views, respectively, of an example of an exemplary stacked IC device 100. The stacked IC device 100 includes a memory die 104A, a memory die 104B, a logic die 110, and a substrate 102. As described in more detail below, the logic die 110 is electrically connected, face-to-face, to the memory dies 104 and is electrically connected to the substrate 102 by conductors 106 that extend through a region between the memory dies 104.

The logic die 110 includes active circuitry (e.g., a plurality of interconnected transistors) arranged to form various functional blocks. Examples of functional blocks that can be included the logic die 110 include, without limitation, arithmetic blocks, logic blocks, flow control blocks, and combinations thereof. In some embodiments, the logic die 110 also includes transistors interconnected to form local memory units, such as registers or cache to temporarily store data during operations.

The active circuitry of the logic die 110 is formed in an active region that is bounded by a face 112, which is shown in FIG. 1B, of the logic die 110. The face 112 of the logic die 110 is opposite a back 114 of the logic die 110. For example, in FIG. 1B, the logic die 110 is illustrated in a face-down orientation in which the face 112 is toward the substrate 102, and the back 114 is oriented away from the substrate 102.

The memory dies 104 includes active circuitry (e.g., a plurality of interconnected transistors) arranged to form blocks of memory cells. For example, the memory dies 104 can include dynamic-random access memory (DRAM) dies, such as double-date rate (DDR) memory dies. The memory dies 104 may also include other circuits, such as read/write circuitry, address decoders, etc.

The active circuitry of each of the memory dies 104 is formed in an active region that is bounded by a face 116 of the memory die 104, and the face 116 of a memory die 104 is opposite a back 118 of the memory die 104. For example, in FIG. 1B, the memory die 104A is illustrated in a face-up orientation in which a face 116A of the memory die 104A is oriented away from the substrate 102, and a back 118A of the memory die 104A is toward the substrate 102. Likewise, in FIG. 1B, the memory die 104B is illustrated in a face-up orientation in which a face 116B of the memory die 104B is oriented away from the substrate 102, and a back 118B of the memory die 104B is toward the substrate 102.

The logic die 110 is stacked on the memory dies 104 and electrically connected, face-to-face, to the memory dies 104. For example, in FIGS. 1A-1C, interconnects 108A electrically connect the logic die 110 to the memory die 104A, and interconnects 108B electrically connect the logic die 110 to the memory die 104A. The interconnects 108 can include conductive pillars (e.g., copper (Cu) pillars), solder bumps, pillar bumps (e.g., pillars that include an attached solder cap), or other types of die-to-die electrical interconnects.

The substrate 102 includes a package substrate of the stacked IC device 100. For example, the substrate 102 can include a plurality of metal layers separated by dielectric layers. In this example, the metal layers are patterned to define metal lines, and selectively interconnected by conductive vias to define conductive paths between an on-package contacts on a top 120 of the substrate and off-package contacts 124 on a bottom 122 of the substrate 102.

The conductors 106 extend through the region between the memory dies 104A and 104B to electrically connect the logic die 110 to the substrate 102. In some embodiments, the conductors 106 are formed on the logic die 110 (e.g., using flip-chip fabrication techniques, as described further below). For example, the conductors 106 can include conductive pillars (e.g., Cu pillars) or pillar bumps. To illustrate, a plurality of electrical interconnects can be formed on the face 112 of the logic die 110, where the plurality of electrical interconnects include the interconnects 108A (e.g., in a memory interconnect region associated with the memory die 104A), the interconnects 108B (e.g., in a memory interconnect region associated with the memory die 104B), and the conductors 106. In this illustrative example, the electrical interconnects formed on the face 112 of the logic die 110 include multiple different characteristic lengths. For example, the interconnects 108A have a first characteristic length, the interconnects 108B have the first characteristic length, and the conductors have a second characteristic length greater than the first characteristic length.

Alternatively, the stacked IC device 100 can include a patch component that defines a body in which the conductors 106 are embedded. In embodiments in which the conductors 106 are embedded in a patch component, the body of the patch component can include a semiconductor (e.g., silicon) or a polymer or polymer-based material. (such as a mold compound, one or more prepreg layers, or another composite material that includes a filler within a polymer matrix). In such embodiments, the patch component can be coupled to the substrate 102 such that an upper surface of the patch component is substantially coplanar with faces 116 of the memory dies 104, in which case electrical interconnects with a single characteristic length can be formed on the face 112 of the logic die 110. In embodiments in which the conductors 106 are embedded in a patch component, the patch component can also include other circuitry, such as active circuitry (e.g., transistors), passive circuitry (e.g., conductive traces, capacitors, inductors, resistors, etc.).

Whether the conductors 106 are embedded in a patch component or not, a height of the conductors 106 is related to a distance between the face 112 of the logic die 110 and the top 120 of the substrate 102. Since the logic die 110 is coupled face-to-face with the memory dies 104, the distance between the face 112 of the logic die 110 and the top 120 of the substrate 102 is limited by the height of the face 116 of the memory dies 104 above the substrate 102. In some embodiments, the top 120 of the substrate 102 defines multiple levels to reduce the distance between the face 112 of the logic die 110 and a portion of the top 120 of the substrate 102. For example, the substrate 102 can define one or more recessed portions, and the memory dies 104 can be coupled to the recessed portions of the substrate 102. In some embodiments, one or more upper metal layers of the substrate 102 (and possibly one or more dielectric layers) can be selectively omitted to define the recessed portions since the backs 118 of the memory dies 104 do not include electrical contacts that need to be connected to the substrate 102.

In some embodiments, the stacked IC device 100 includes mold compound at least partially encapsulating the memory dies 104, the logic die 110, the conductors 106, the interconnects 108, or a combination thereof. For example, the stacked IC device 100 can include mold compound between the memory dies 104, in which case the conductors 106 can include through mold vias.

In some embodiments, the stacked IC device 100 includes one or more redistribution layers (RDLs). For example, RDL(s) can be coupled to the logic die 110, in which case the interconnects 108, the conductors 106, or both, are electrically connected to the circuitry of the logic die 110 through the RDL(s).

Although the stacked IC device 100 in FIGS. 1A-1C only shows electrical connections to the memory dies 104 in an area underlying the logic die 110, in other embodiments, one or more of the memory dies 104 include additional contacts on the face 116 of the memory die 104 in an area that is not covered by the logic die 110. In such embodiments, the stacked IC device 100 can include additional electrical connections to the memory die(s) 104. For example, wire bonds can be used to electrically connect the additional contacts on the face 116 of the memory die 104 to contacts on the top 120 of the substrate 102. Non-limiting examples of stacked IC devices that include wire bonds electrically connecting the memory dies 104 to the substrate 102 are described with reference to FIGS. 8 and 9.

Although the stacked IC device 100 is illustrated in FIGS. 1A-1C as including a single logic die 110 and two memory dies 104, the stacked IC device 100 can include more than one logic die 110, more than two memory dies 104, or both. In an embodiment in which the stacked IC device 100 includes two or more logic dies 110, the logic dies 110 may be electrically connected to one another via conductive paths through the substrate 102, through a patch component that includes the conductors 106, or both. Non-limiting examples of stacked IC devices that include more than one logic die are described with reference to FIGS. 5, 6, and 11.

In some embodiments in which the stacked IC device 100 includes more than two memory dies 104, a single logic die 110 can be electrically connected, face-to-face, with each of the memory dies 104. A non-limiting example of a stacked IC device that includes one logic die 110 electrically connected, face-to-face, with more than two memory dies 104 is described with reference to FIG. 10.

In some embodiment in which the stacked IC device 100 includes more than two memory dies 104, a single logic die 110 can be electrically connected, face-to-face, with a subset of the memory dies 104 and electrically connected via the substrate 102 to the remainder of the memory dies 104. For example, one or more additional memory dies 104 can be coupled, face-to-back, with one or both of the memory dies 104 that are coupled face-to-face with the logic die 110. In this arrangement, wire bonds can be used to connect the additional memory dies 104 to the substrate 102. A non-limiting example of a stacked IC device that includes additional memory dies electrically connected to the substrate using wire bonds is described with reference to FIG. 9.

In some embodiment in which the stacked IC device 100 includes more than two memory dies 104 and more than one logic die 110, at least one of the logic dies 110 can be electrically connected, face-to-face, with at least two of the memory dies 104 and electrically connected to the substrate 102 by the conductors. A non-limiting example of a stacked IC device that includes multiple logic dies 110 and more than two memory dies 104 is described with reference to FIG. 11.

Non-limiting examples of stacked IC devices that include more than two memory dies are described with reference to FIGS. 9-11. Additionally, in some embodiments, the stacked IC device 100 can include additional components. For example, the stacked IC device 100 can correspond to or be included within an integrated device that includes communications circuitry (e.g., one or more wireless transceivers, one or more modems, etc.), sensors (e.g., global positioning system sensors, inertial sensors, image sensors, etc.), special-purpose or general-purpose processors (e.g., central processing units, graphics processing units, artificial intelligence processing units, various co-processors and accelerator, etc.).

Figure 2:
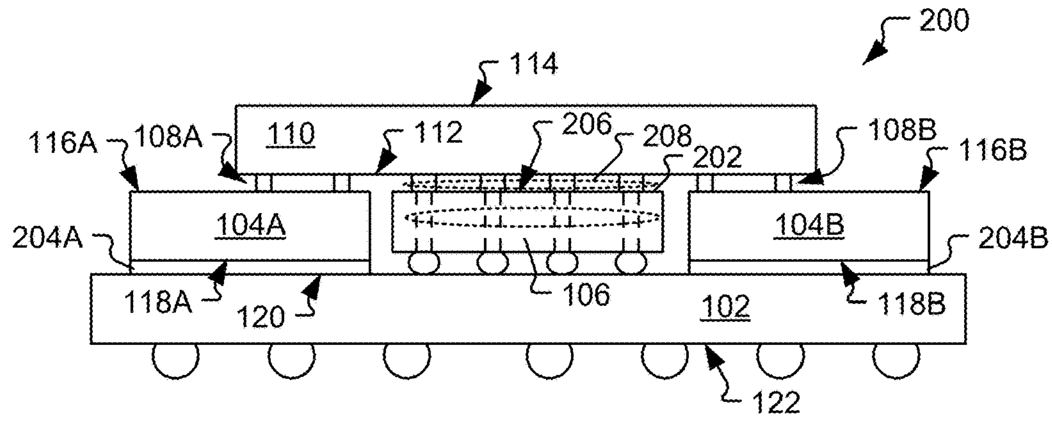
FIG. 2 illustrates schematic elevational view of another example of the exemplary stacked IC device of FIG. 1A.

FIG. 2 illustrates a schematic elevational view of another example of an exemplary stacked IC device 200. In a particular aspect, the stacked IC device 200 of FIG. 2 represents an example of the stacked IC device 100 of FIGS. 1A-1C in which at least a portion of the conductors 106 extend through a body of a patch component 202. Except as otherwise specifically indicated, the stacked IC device 200 can include any of the features, functions, and/or alternative configurations described with reference to FIGS. 1A-1C. For example, the stacked IC device 200 includes the memory die 104A, the memory die 104B, the logic die 110, and the substrate 102 described with reference to FIGS. 1A-1C. Further, features of the stacked IC device 200 of FIG. 2 may be present in the stacked IC device 100, even if such features are not specifically illustrated in FIGS. 1A-1C.

In FIG. 2, the logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102. FIG. 2 also shows an adhesive layer 204A coupling the back 118A of the memory die 104A to the top 120 of the substrate 102, and an adhesive layer 204B coupling the back 118B of the memory die 104B to the top 120 of the substrate 102. The logic die 110 is stacked on the memory dies 104 and electrically connected, face-to-face, to the memory dies 104 by interconnects 108.

The conductors 106 of FIG. 2 extend through the body of the patch component 202. In some embodiments, the body of the patch component 202 includes a semiconductor, such as silicon. For example, in some such embodiments, the conductors 106 include through silicon vias (TSVs). In other embodiments, the body of the patch component 202 includes a polymer, such as mold compound, one or more prepreg layers, or another composite material that includes a filler within a polymer matrix. An advantage of forming the body of semiconductor and conductors 106 as TSVs is that use of semiconductor fabrication processes enable formation of more densely spaced conductors 106 (e.g., conductors 106 with a finer pitch and/or a smaller diameter). An advantage of forming the body of polymer is that lower cost fabrication processes can be used to form the patch component 202. As a non-limiting example, a silicon-based patch component 202 can include conductors 106 with a pitch as small as about 6 micrometers and a diameter as small as about 4 micrometers; whereas a copper posts in a polymer-based patch component 202 can form conductors with a pitch as small as about 80 micrometers and a diameter as small as about 40 micrometers.

In some embodiments, a thickness of the patch component 202 and electrical interconnects used to attach the patch component 202 to the substrate 102 are selected such that an upper surface 206 of the patch component 202 is substantially coplanar with the faces 116 of the memory dies 104. In such embodiments, the interconnects 108 used to electrically connect the logic die 110 to the memory dies 104 are substantially the same length as electrical interconnects 208 used to electrically connect the logic die 110 to the patch component 202.

Figure 3:
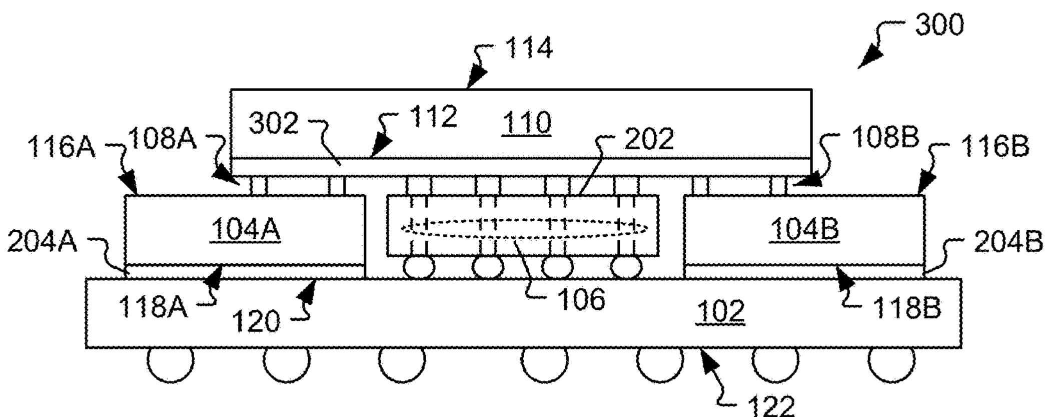
FIG. 3 illustrates schematic elevational view of another example of the exemplary stacked IC device of FIG. 1A.

FIG. 3 illustrates a schematic elevational view of another example of an exemplary stacked IC device 300. In a particular aspect, the stacked IC device 300 of FIG. 3 represents an example of the stacked IC device 100 of FIGS. 1A-1C. Except as otherwise specifically indicated, the stacked IC device 300 can include any of the features, functions, and/or alternative configurations described with reference to FIGS. 1A-1C. For example, the stacked IC device 300 includes the memory die 104A, the memory die 104B, the logic die 110, and the substrate 102 described with reference to FIGS. 1A-1C. The logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102.

FIG. 3 also shows one or more redistribution layers (RDLs) 302 are coupled to the logic die 110. The RDLs 302 define conductive paths between contacts of the logic die 110 and contacts of the memory dies 104, the patch component 202, or both. For example, the RDLs 302 can be used to map memory I/O contacts of the logic die 110 to contacts of the memory dies 104. In some embodiments, the RDLs 302 can include passive circuit components, such as capacitors. In such embodiments, the passive circuit components of the RDLs 302 can be electrically connected to a power distribution network of the logic die 110 to improve performance of the power distribution network.

In various embodiments, features of the stacked IC device 300 of FIG. 3 may be present in the stacked IC device 100 or the stacked IC device 200. For example, the stacked IC device 100, the stacked IC device 200, or both, can include the RDLs 302 illustrated in FIG. 3.

Figure 4:
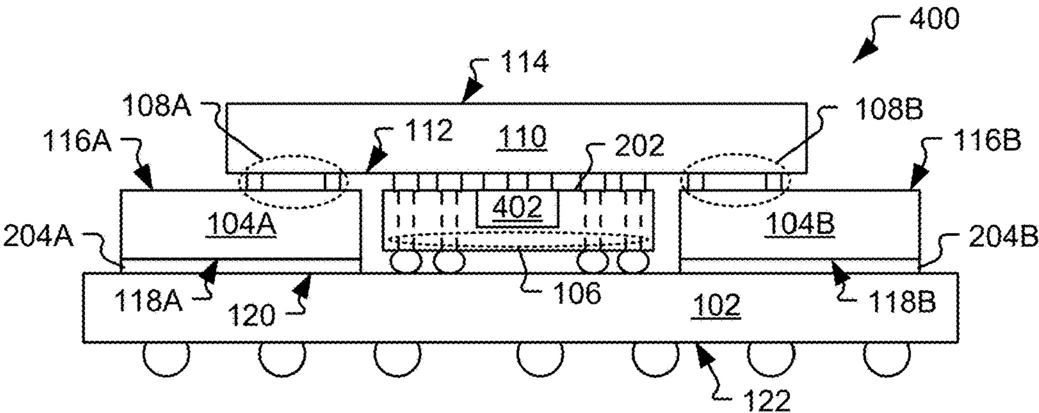
FIG. 4 illustrates schematic elevational view of another example of the exemplary stacked IC device of FIG. 1A.

FIG. 4 illustrates a schematic elevational view of another example of an exemplary stacked IC device 400. In a particular aspect, the stacked IC device 400 of FIG. 4 represents an example of the stacked IC device 100 of FIGS. 1A-1C in which at least a portion of the conductors 106 extend through a body of a patch component 202. Except as otherwise specifically indicated, the stacked IC device 400 can include any of the features, functions, and/or alternative configurations described with reference to FIGS. 1A-1C. For example, the stacked IC device 400 includes the memory die 104A, the memory die 104B, the logic die 110, and the substrate 102 described with reference to FIGS. 1A-1C. The logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102.

In FIG. 4, the patch component 202 includes circuitry 402. The circuitry 402 can include, for example, active components (e.g., transistors) and/or passive components (e.g., inductors, conductors, resistors, etc.). As one example, the circuitry 402 can include capacitors that are electrically connected to a power distribution network of the logic die 110 to improve performance of the power distribution network.

In various embodiments, features of the stacked IC device 400 of FIG. 4 may be present in any of the stacked IC devices of FIGS. 1A-3 that includes the conductors 106 in a patch component 202.

Figure 5:
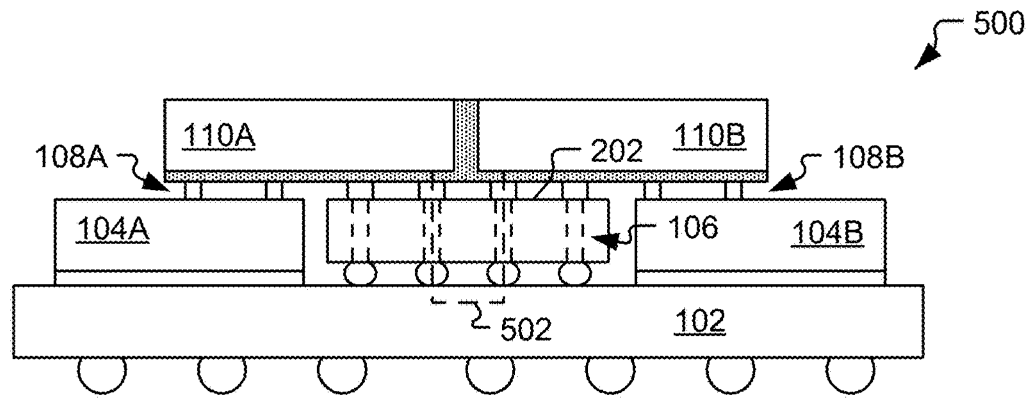
FIG. 5 illustrates schematic elevational view of another example of the exemplary stacked IC device of FIG. 1A.
Figure 6:
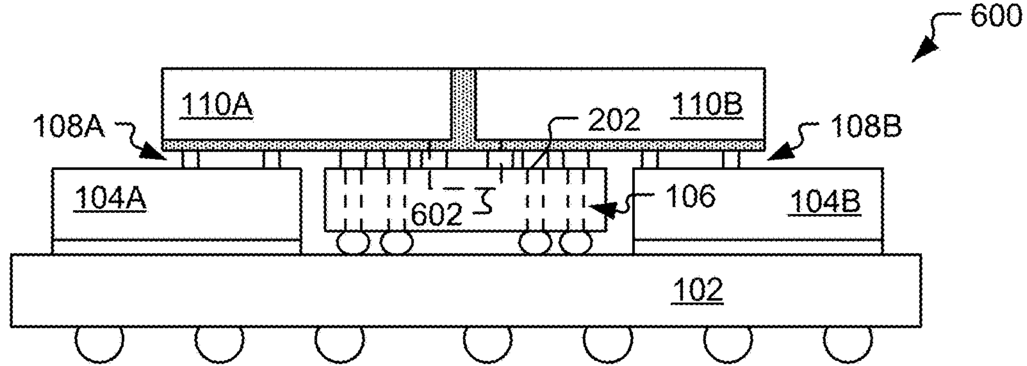
FIG. 6 illustrates schematic elevational view of another example of the exemplary stacked IC device of FIG. 1A.

FIGS. 5 and 6 illustrate schematic elevational views of other examples of exemplary stacked IC devices 500 and 600, respectively. In a particular aspect, the stacked IC devices 500 and 600 represent examples of the stacked IC device 100 of FIGS. 1A-1C that include at least two logic dies 110. Except as otherwise specifically indicated, the stacked IC device 500 and 600 can include any of the features, functions, and/or alternative configurations described with reference to FIGS. 1A-1C.

In each of FIGS. 5 and 6, a logic die 110A is electrically connected, face-to-face, with a memory die 104A, and a logic die 110B is electrically connected, face-to-face, with a memory die 104B. Each of the logic dies 110 is electrically connected to the substrate 102 via conductors that extend between the memory dies 104. In some embodiments, each of the logic dies 110 is also connected, face-to-face, with at least one additional memory die 104. In such embodiments, the stacked IC devices 500 and 600 may include additional conductors 106 between additional pairs of adjacent memory devices. For example, FIG. 10 illustrates a top view of an example of a stacked IC device 1000 that includes two logic dies 110, which are each electrically connected, face-to-face, with two memory dies 104. In a particular aspect, either of the elevational views of FIGS. 5 and 6 may correspond to an elevational view as viewed in the direction indicated by indicator B of the stacked IC device 1000 of FIG. 10.

In each of FIGS. 5 and 6, one or more conductive paths electrically connect the logic die 110A and the logic die 110B to one another. For example, in FIG. 5, a conductive path 502 extends through one of the conductors 106, through one or more conductors of the substrate 102, and through another of the conductors 106. Thus, in FIG. 5, a portion of the conductive path 502 between the logic dies 110 is on or in the substrate 102. In FIG. 6, a conductive path 602 extends through one of the conductors 106 through one or more conductors of the patch component 202, and through another of the conductors 106. Thus, in FIG. 6, the conductive path 602 between the logic dies 110 is in the patch component 202. In some embodiments, aspects of FIGS. 5 and 6 may be combined. For example, a stacked IC device can include the conductive path 502 and the conductive path 602.

In various embodiments, features of the stacked IC device 500 of FIG. 5, the stacked IC device 600 of FIG. 6, or both, may be present in any of the stacked IC devices of FIGS. 1A-3 that includes the conductors 106 in a patch component 202.

Figure 7:
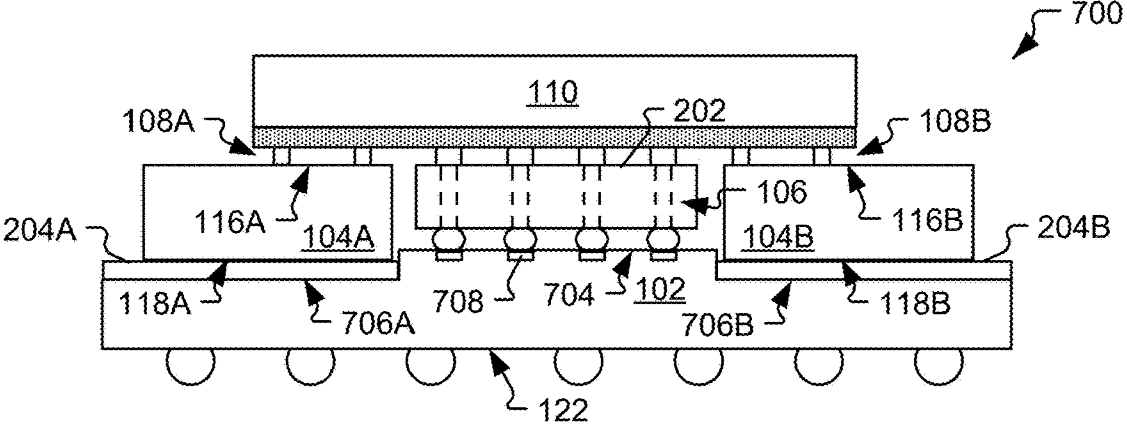
FIG. 7 illustrates schematic elevational view of another example of the exemplary stacked IC device of FIG. 1A.

FIG. 7 illustrates a schematic elevational view of another example of an exemplary stacked IC device 700. In a particular aspect, the stacked IC device 700 of FIG. 7 represents an example of the stacked IC device 100 of FIGS. 1A-1C in which the substrate 102 includes different levels. Except as otherwise specifically indicated, the stacked IC device 700 can include any of the features, functions, and/or alternative configurations described with reference to FIGS. 1A-1C. For example, the stacked IC device 700 includes the memory die 104A, the memory die 104B, the logic die 110, and the substrate 102 described with reference to FIGS. 1A-1C. The logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102.

In FIG. 7, the substrate 102 includes level 704 that includes contacts 708 (e.g. on-package contacts) electrically connected to the conductors 106. The substrate 102 also includes one or more levels 706 to which the memory dies 104 are coupled (e.g. by bond layers 204). The level(s) 706 are recessed relative to the level 704. In a particular embodiment, one or more metal layers associated with the contacts 708 are present in a portion of the substrate 102 associated with the level 704 and are omitted from portions of the substrate 102 associated with the levels 706. Thus, the level(s) 706 define recesses in a top side of the substrate 102. The depth of the recesses (relative to the level 704) depends on the number and type of layers omitted to form the recesses.

In a particular aspect, providing recesses in the substrate 102 for the memory dies 104 can enable use of shorter conductors 106. Shorter conductors 106 may be simpler and/or cheaper to fabricate. Additionally, techniques to fabricate longer conductors 106 are generally also associated with less dense arrangements of conductors 106. For example, through silicon vias (TSVs) used as the conductors 106 can have small diameters and small pitch distances; however, fabrication of TSVs is more expensive for taller TSVs than for shorter TSVs. Additionally, using TSVs as the conductors 106 is generally limited (due to current technology and economic considerations) to heights of about 200 micrometers. Thus, reducing the distance spanned by conductors (e.g., the distance between the logic die 110 and the contacts 708) may enable use of TSVs for the conductors 106, which enables denser arrangements of the conductors.

In various embodiments, features of the stacked IC device 700 of FIG. 7 may be present in any of the stacked IC devices of FIGS. 1A-6. Although FIG. 7 illustrates a patch component 202, the substrate 102 with multiple levels 704, 706 of FIG. 7 can be used in embodiments that do not include a patch component.

Figure 8:
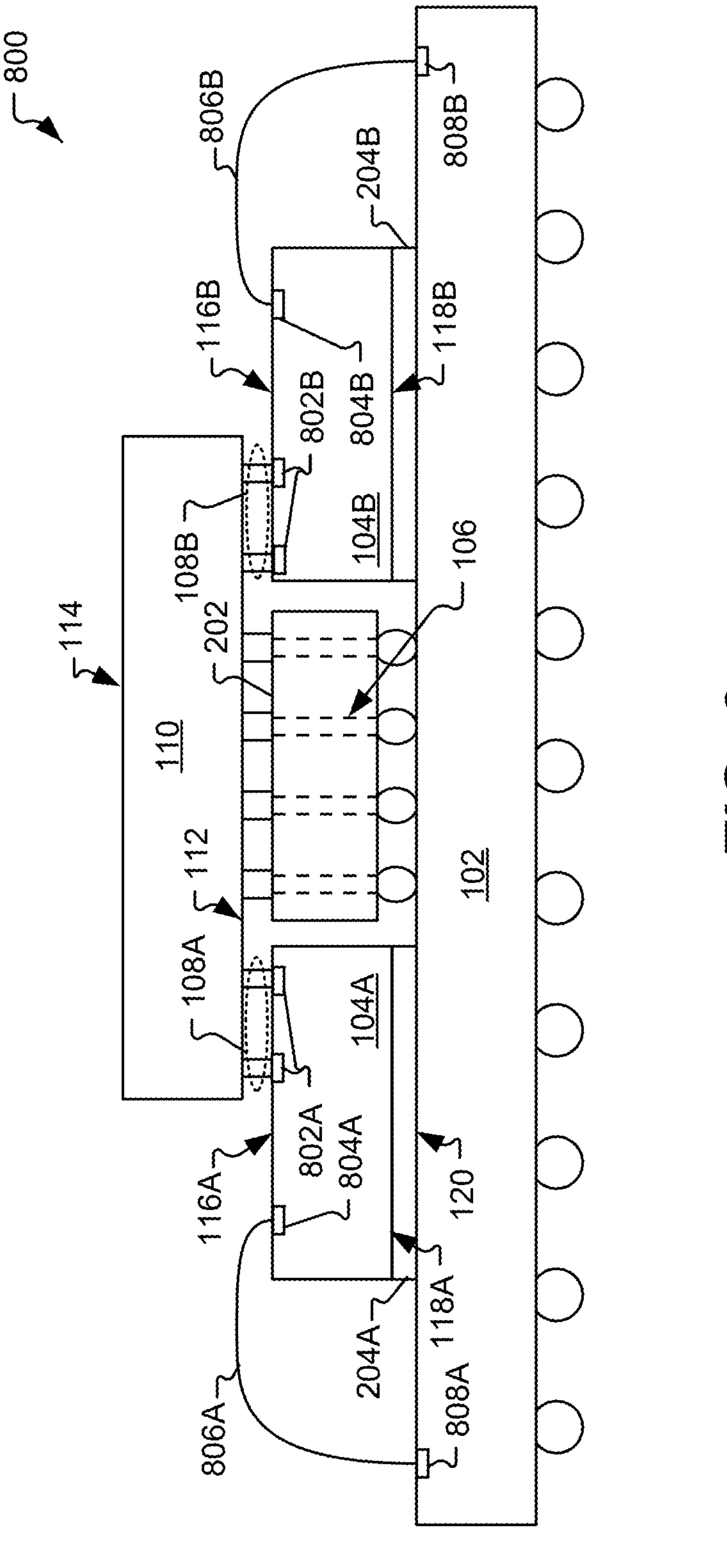
FIG. 8 illustrates schematic elevational view of another example of the exemplary stacked IC device of FIG. 1A.

FIG. 8 illustrates a schematic elevational view of another example of an exemplary stacked IC device 800. In a particular aspect, the stacked IC device 800 of FIG. 8 represents an example of the stacked IC device 100 of FIGS. 1A-1C in which some electrical connections to the memory dies 104 use wire bonds. Except as otherwise specifically indicated, the stacked IC device 800 can include any of the features, functions, and/or alternative configurations described with reference to FIGS. 1A-1C. For example, the stacked IC device 800 includes the memory die 104A, the memory die 104B, the logic die 110, and the substrate 102 described with reference to FIGS. 1A-1C. The logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102.

In FIG. 8, the face 116 of each of the memory dies 104 includes contacts 802 electrically connected, face-to-face, with corresponding contacts of the logic die 110 and includes one or more additional contacts 804. The additional contact(s) 804 are electrically connected, by wire bonds 806, to contacts 808 of the substrate 102. For example, the memory die 104A includes contacts 802A that are electrically connected, by interconnects 108A to contacts on the face 112 of the logic die, and the memory die 104B includes contacts 802B that are electrically connected, by interconnects 108B to contacts on the face 112 of the logic die. Additionally, the memory die 104A includes additional contact(s) 804A that are electrically connected, by wire bond(s) 806A to contact(s) 808A of the substrate 102, and the memory die 104B includes additional contact(s) 804B that are electrically connected, by wire bond(s) 806B to contact(s) 808B of the substrate 102.

In various embodiments, features of the stacked IC device 800 of FIG. 8 may be present in any of the stacked IC devices of FIGS. 1A-7. Although FIG. 8 illustrates a patch component 202, wire bonds 806 electrically connecting contacts 804 of the memory dies 104 to contacts 808 of the substrate 102 can be used in embodiments that do not include a patch component.

Figure 9:
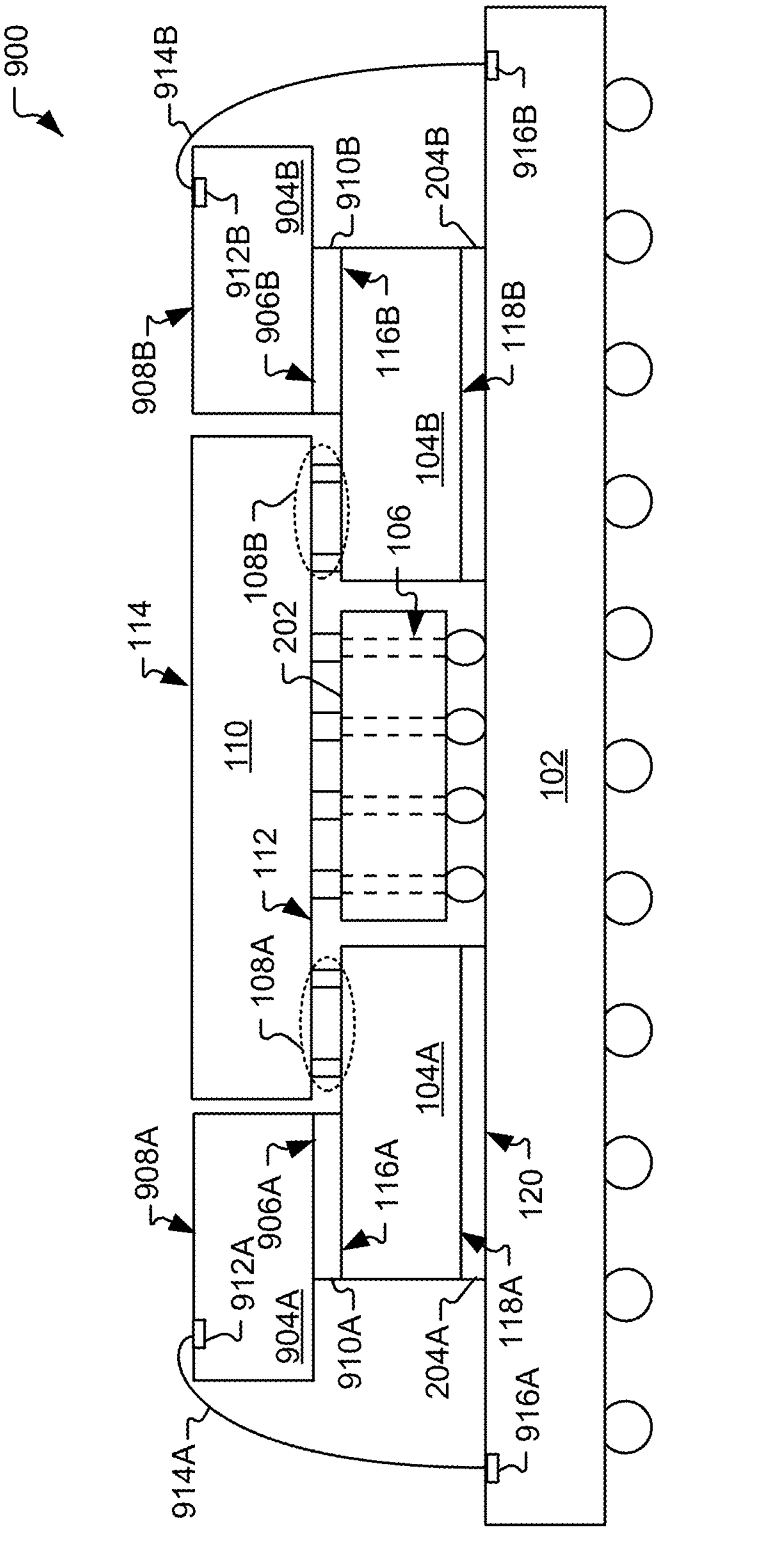
FIG. 9 illustrates schematic elevational view of another example of the exemplary stacked IC device of FIG. 1A.

FIG. 9 illustrates a schematic elevational view of another example of an exemplary stacked IC device 900. In a particular aspect, the stacked IC device 900 of FIG. 9 represents an example of the stacked IC device 100 of FIGS. 1A-1C including one or more additional memory dies stacked with the memory dies 104. Except as otherwise specifically indicated, the stacked IC device 900 can include any of the features, functions, and/or alternative configurations described with reference to FIGS. 1A-1C. The stacked IC device 900 includes the memory die 104A, the memory die 104B, the logic die 110, and the substrate 102 described with reference to FIGS. 1A-1C. The logic die 110 is illustrated in a face-down orientation in which the face 112 of the logic die 110 is toward the substrate 102, and the back 114 is oriented away from the substrate 102. Further, each of the memory dies 104 is illustrated in a face-up orientation in which the face 116 of the memory die 104 is oriented away from the substrate 102, and the back 118 of the memory die 104 is toward the substrate 102.

In FIG. 9, an additional memory die 904 is attached to the face 116 of each of the memory dies 104 by a bond layer 910. The additional memory dies 904 are attached to the memory dies 104 in a face-to-back configuration. For example, a back 906A of the additional memory die 904A is coupled, via the bond layer 910A, to the face 116A of the memory die 104A, and a back 906B of the additional memory die 904B is coupled, via the bond layer 910B, to the face 116B of the memory die 104B. Faces 908 of the additional memory dies 904 include contacts 912 that are electrically connected, by wire bonds 914, to contacts 916 of the substrate 102. For example, a face 908A of the additional memory dies 904A includes contacts 912A that are electrically connected, by wire bonds 914A, to contacts 916A of the substrate 102, and a face 908B of the additional memory dies 904B includes contacts 912B that are electrically connected, by wire bonds 914B, to contacts 916B of the substrate 102.

In various embodiments, features of the stacked IC device 900 of FIG. 9 may be present in any of the stacked IC devices of FIGS. 1A-7. Although FIG. 9 illustrates a patch component 202, the additional memory die(s) 904 and wire bond(s) 914 electrically connecting contacts 912 of the additional memory die(s) 904 to contacts 916 of the substrate 102 can be used in embodiments that do not include a patch component.

Figures 10, 11:
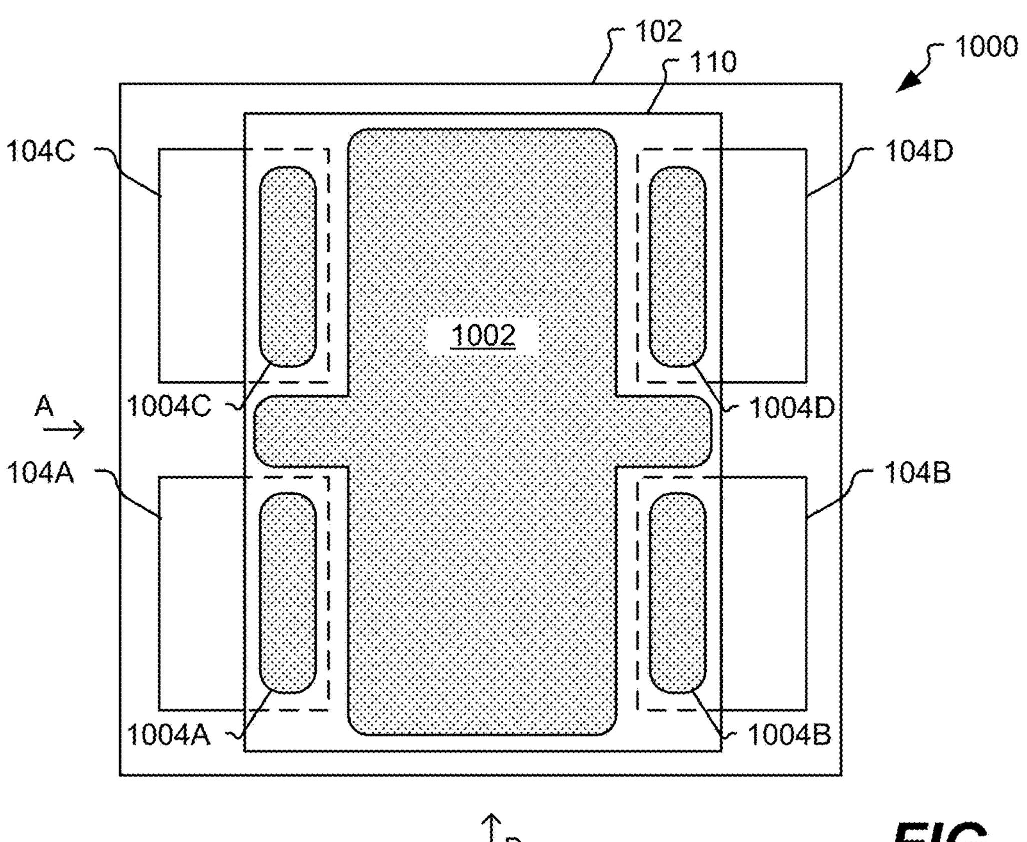
FIG. 10 illustrates schematic top view of an example of the exemplary stacked IC device of FIG. 1A.
FIG. 11 illustrates schematic top view of another example of the exemplary stacked IC device of FIG. 1A.

FIGS. 10 and 11 illustrate schematic top views of examples of the exemplary stacked IC devices 1000, 1100, respectively. Each of the stacked IC devices 1000, 1100 of FIGS. 10 and 11 includes one or more logic dies 110, memory dies 104, and a substrate 102. FIGS. 10 and 11 include shaded regions 1002, 1004 representing areas where electrical interconnections between various components can be positioned. In particular, the regions 1002 represent areas that may include the conductors 106 electrically connecting the logic die(s) 110 to the substrate 102, and the regions 1004 represent memory interconnect regions (e.g., areas where face-to-face electrical connections between the logic die(s) 1002 and the memory dies 104 may be located).

In FIG. 10, the stacked IC device 1000 includes four memory dies 104 (including memory die 104A, memory die 104B, memory die 104C, and memory die 104D) and one logic die 110. The logic die 110 is electrically connected, face-to-face, with the memory die 104A by interconnects in a region 1004A, is electrically connected, face-to-face, with the memory die 104B by interconnects in a region 1004B, is electrically connected, face-to-face, with the memory die 104C by interconnects in a region 1004C, and is electrically connected, face-to-face, with the memory die 104D by interconnects in a region 1004D. Additionally, the logic die 110 is electrically connected to the substrate 102 by conductors in the region 1002. FIG. 10 also shows a direction indicator A and a direction indicator B. The direction indicators A and B of FIG. 10 show view directions for the elevational views represented by any of the elevational views of any of FIG. 1B, 2-4, or 7-9.

In FIG. 11, the stacked IC device 1100 includes four memory dies 104 (including the memory die 104A, the memory die 104B, the memory die 104C, and the memory die 104D) and two logic dies 110 (including logic die 110A and logic die 110B). The logic die 110A is electrically connected, face-to-face, with the memory die 104A by interconnects in a region 1004A and is electrically connected, face-to-face, with the memory die 104C by interconnects in a region 1004C. The logic die 110B is electrically connected, face-to-face, with the memory die 104B by interconnects in a region 1004B and is electrically connected, face-to-face, with the memory die 104D by interconnects in a region 1004D. Additionally, the logic die 110A is electrically connected to the substrate 102 by conductors in the region 1002A, and the logic die 110B is electrically connected to the substrate 102 by conductors in the region 1002B. FIG. 11 also shows a direction indicator A and a direction indicator B. The direction indicator A shows a view direction for the elevational views represented by any of FIG. 1B, 2-4, or 7-9. The direction indicator B shows a view direction for the elevational views of FIG. 5 or FIG. 6.

Exemplary Sequences for Fabricating Patch Components

Figure 12:
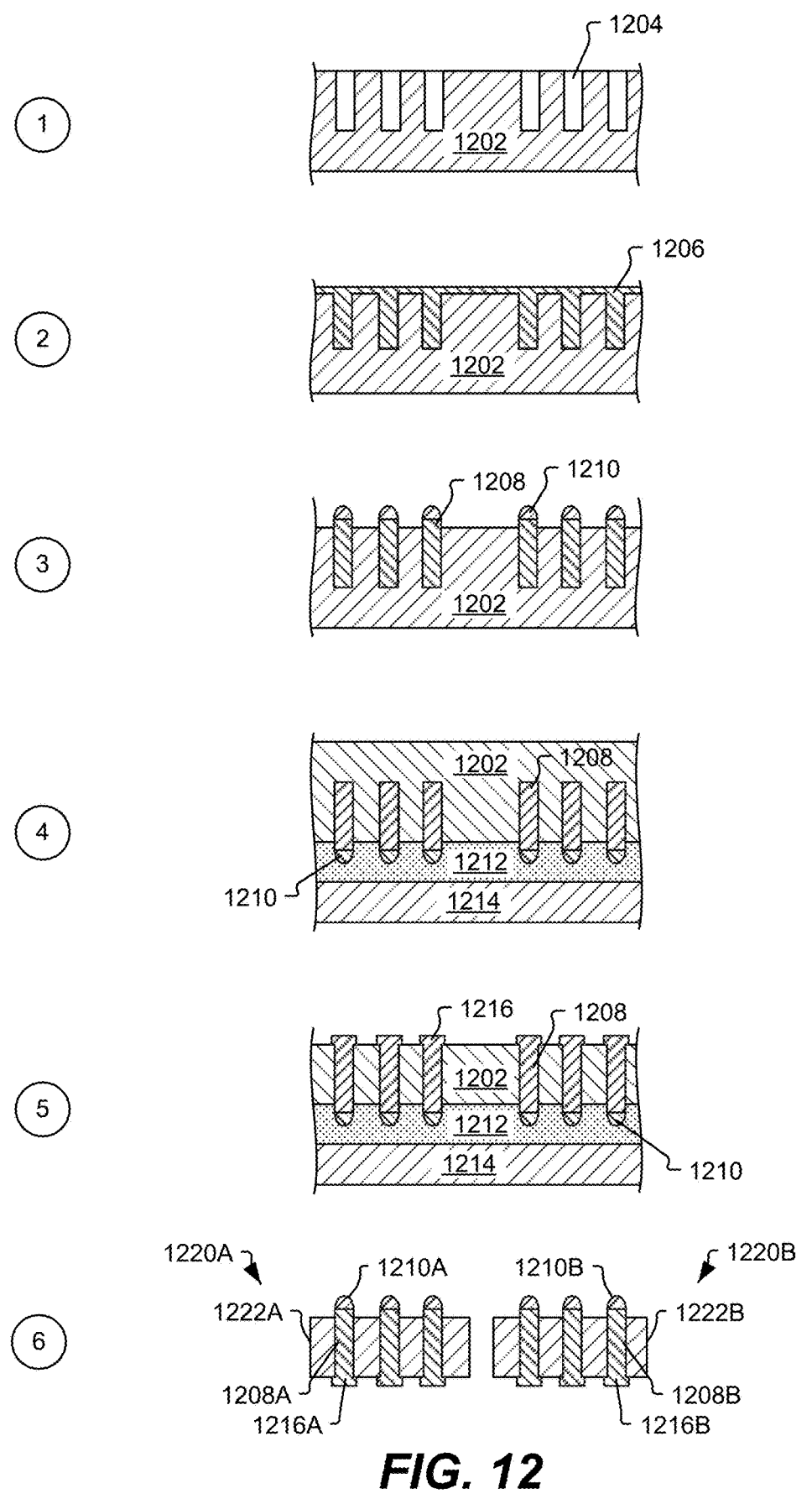

In some implementations, fabricating a patch component (e.g., the patch component 202 of any of FIGS. 2-9) includes several processes. FIG. 12 illustrates an exemplary sequence for fabricating a semiconductor-based patch component. In some implementations, the sequence of FIG. 12 may be used to provide (e.g., during fabrication of) the patch component 202 for one or more of the stacked IC devices 100, 200, 300, 400, 500, 600, 700, 800 or 900 of FIGS. 1A-9.

It should be noted that the sequence of FIG. 12 may combine two or more stages in order to simplify and/or clarify the sequence for providing or fabricating the semiconductor-based patch component. In some examples, the order of the processes may be changed or modified. In some examples, one or more of the processes may be replaced or substituted without departing from the scope of the disclosure. In the following description, reference is made to various illustrative stages of the sequence, which are numbered (using circled numbers) in FIG. 12. Each of the various stages of the sequence illustrated in FIG. 12 shows formation of two semiconductor-based patch components (e.g., using wafer-level, reconstructed wafer-level, or a strip- or panel-level operations). In other implementations, each semiconductor-based patch component can be formed individually.

FIG. 12 depicts schematic cross-sectional representations of Stages during formation of semiconductor-based patch components. Stage 1 of FIG. 12 illustrates a state after formation of openings 1204 in a semiconductor layer 1202. For example, the semiconductor layer 1202 can include a semiconductor wafer, and operations described with reference to FIG. 12 can include wafer-level operations. The openings 1204 may be formed using one or more etching operations guided by a patterned resist layer. Alternatively, in some embodiments, the openings 1204 can be formed using one or more drilling operations (e.g., laser drilling or mechanical drilling).

Stage 2 illustrates a state after formation of a layer of a conductive material 1206. The conductive material 1206 (e.g., copper) is formed to fill the openings 1204 or to plate sidewalls of the openings 1204. The layer of the conductive material 1206 may be formed using one or more deposition operations, such as chemical vapor deposition, physical vapor deposition, electroplating, or a combination thereof. In FIG. 12, the layer of conductive material 1206 is shown as including a layer on a surface of the semiconductor layer 1202; however, formation of the layer of material on the surface of the semiconductor layer 1202 is optional and may be omitted depending on the specific process operations used to form the layer of conductive material 1206.

Stage 3 illustrates a state after further processing of the layer of conductive material 1206 to electrically isolate vias 1208 from one another and after formation of solder bumps 1210 on the vias 1208. Processing the layer of conductive material 1206 to electrically isolate the vias 1208 is optional. For example, if the processing operations used to form the layer of conductive material 1206 are controlled to avoid formation of the layer of material on the surface of the semiconductor layer 1202 illustrated at Stage 2, then operations to electrically isolate the vias 1208 can be omitted.

In implementations in which portions of the layer of conductive material 1206 are removed to electrically isolate the vias 1208 from one another, the portions of the layer of conductive material 1206 may be removed using one or more material removal processes appropriate to the conductive material, such as one or more etching operations, one or more grinding operations, one or more polishing operations, etc. For example, in some implementations, one or more grinding operations are performed to remove portions of the layer of conductive material 1206 such that ends of the vias 1208 are substantially coplanar with the upper surface of the semiconductor layer 1202.

In the example illustrated at Stage 3, ends of the vias 1208 extend past an upper surface of the semiconductor layer 1202, which is optional. In implementations in which the ends of the vias 1208 are coplanar with the upper surface of the semiconductor layer 1202, the upper surface of the semiconductor layer 1202 may be etched to provide a desired standoff height of the ends of the vias 1208. Alternatively, one or more additional deposition operations may be performed to form contacts that are electrically connected to the vias 1208 and that extend above the upper surface of the semiconductor layer 1202.

The solder bumps 1210 are optional examples of contacts that can be formed on the vias 1208. In some implementations, the solder bumps 1210 are omitted or replaced with a different type of contact, such as conductive pads. For implementations that include the solder bumps 1210, the solder bumps 1210 may be formed using one or more deposition operations to deposit solder on ends of the vias 1208 (or on contacts electrically connected to the vias 1208). To illustrate, a patterned resist layer can be formed on the surface of the semiconductor layer 1202 and used to guide formation (e.g. deposition) of the solder bumps 1210 on the vias 1208. In some implementations, a barrier layer (e.g., a nickel layer) can be formed on the ends of the vias 1208 before the solder bumps 1210.

Stage 4 illustrates a state after flipping the semiconductor layer 1202 and coupling the semiconductor layer 1202 to a carrier 1214 using a bond layer 1212. For example, for a wafer-level process, the semiconductor layer 1202 may include a semiconductor wafer, and the carrier 1214 may include a carrier wafer. In other examples, the semiconductor layer 1202 includes less than a full wafer, such as a panel or strip, and the carrier 1214 is sized based on a form-factor of the semiconductor layer 1202.

Stage 5 illustrates a state after formation of conductive pads 1216. For example, formation of the conductive pads 1216 may include performing one or more grinding operations to remove a portion of the semiconductor layer 1202 to expose ends of the vias 1208. Subsequently, one or more deposition operations guided by a patterned resist layer may be performed to form the conductive pads 1216 on the ends of the vias 1208. The conductive pads 1216 are optional examples of contacts that can be formed on the vias 1208. In some implementations, the conductive pads 1216 are omitted or replaced with a different type of contact, such as solder bumps.

Stage 6 illustrates a state after removal of the bond layer 1212 and the carrier 1214 and after individuation of multiple patch components 1220 from the semiconductor layer 1202. In some implementations, one or both sides of the patch components 1220 include exposed ends of the vias 1208. In other implementations, one or both sides of the patch component 1220 include contacts on ends of the vias 1208, where the contacts include solder bumps (e.g., solder bumps 1210), conductive pads (e.g., conductive pads 1216), or similar structures. One or more delamination processes can be used to remove the bond layer 1212 and the carrier 1214, and one or more cutting operations can be used to separate the patch components 1220 from one another.

Formation of the patch components 1220 (including patch component 1220A and patch component 1220B) is complete at Stage 6 of FIG. 12. In FIG. 12, the patch component 1220A includes a body 1222A that includes a semiconductor (e.g., silicon) and a plurality of vias 1208A (e.g., through silicon vias) extending therethrough. Ends of each of the vias 1208A are prepared to form electrical connections with a substrate or a logic die. For example, in FIG. 12, one end of each via 1208A includes a solder bump 1210A, and the other end of each via 1208A includes a conductive pad 1216A. Similarly, the patch component 1220B includes a body 1222B that includes a semiconductor (e.g., silicon) and a plurality of vias 1208B (e.g., through silicon vias) extending therethrough. Each of the vias 1208B includes a solder bump 1210B at one end and a conductive pad 1216B at the other end.

In FIG. 12, two patch components 1220 are illustrated; however, as explained above, wafer-level processes can be used to form the patch components 1220, and such wafer-level processing can concurrently form many more than two (e.g., tens or hundreds) of patch components 1220. Further, in FIG. 12, each patch component 1220 is illustrated as including three vias 1208, with each via 1208 including a solder bump 1210 at one end, and a conductive pad 1216 at the other end. As explained above, the patch components 1220 can be fabricated in various ways, resulting in different end configurations of the vias 1208. For example, each end of each via 1208 can include a solder bump 1210, or each end of each via 1208 can include a conductive pad 1216. Additionally, three vias 1208 per patch component 1220 is merely illustrative, and the patch components 1220 can include more than three vias 1208.

In some embodiments, the semiconductor layer 1202 can include circuitry, such as active circuit components (e.g., transistors), passive circuit components (e.g., capacitors, inductors, resistors), conductors (e.g., traces) formed prior to Stage 1 of FIG. 12 or formed between two Stages of FIG. 12 (such as between Stages 2 and 3). In such embodiments, the patch component 1220 can include the circuitry 402 of FIG. 4, the conductive path(s) 602 of FIG. 6, or both.

Figure 13:
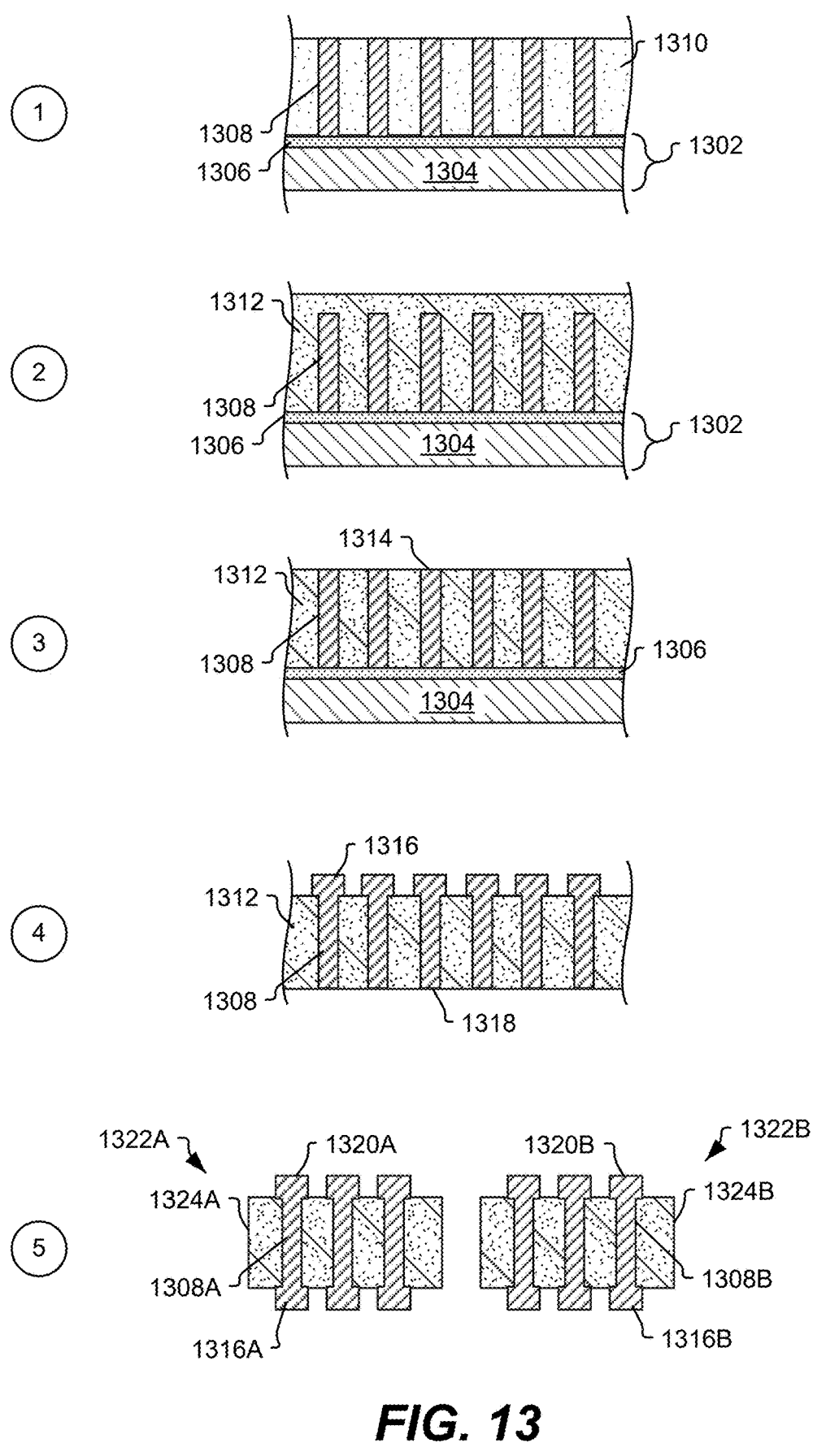

FIG. 13 illustrates an exemplary sequence for fabricating a polymer-based patch component. In some implementations, the sequence of FIG. 13 may be used to provide (e.g., during fabrication of) the patch component 202 for one or more of the stacked IC devices 100, 200, 300, 400, 500, 600, 700, 800 or 900 of FIGS. 1A-9.

It should be noted that the sequence of FIG. 13 may combine two or more stages in order to simplify and/or clarify the sequence for providing or fabricating the polymer-based patch component. In some examples, the order of the processes may be changed or modified. In some examples, one or more of the processes may be replaced or substituted without departing from the scope of the disclosure. In the following description, reference is made to various illustrative stages of the sequence, which are numbered (using circled numbers) in FIG. 13. Each of the various stages of the sequence illustrated in FIG. 13 shows formation of two polymer-based patch components (e.g., using wafer-level, reconstructed wafer-level, or strip- or panel-level operations). In other implementations, each polymer-based patch component can be formed individually.

FIG. 13 depicts schematic cross-sectional representations of Stages during formation of polymer-based patch components. Stage 1 illustrates a state after formation of conductive posts 1308 (e.g., copper posts) on a carrier structure 1302 that includes a bond layer 1306 and a carrier 1304 (e.g., a carrier wafer). For example, the conductive posts 1308 can be formed using one or more deposition operations, such as electroplating, guided by a patterned resist layer 1310. Openings in the patterned resist layer 1310 define the locations and diameters of the conductive posts 1308.

Stage 2 illustrates a state after removal of the patterned resist layer 1310 and formation of a polymer layer 1312 on the carrier structure 1302 (and on or over the conductive posts 1308). The polymer layer 1312 can include a resin, which optionally can include fillers. As an example, the polymer layer 1312 can include mold compound or a resin used for formation of RDLs. One or more deposition operations (e.g., spraying, printing, dispensing) can be used to apply the polymer layer 1312 to the carrier structure 1302. The polymer layer 1312 can subsequently be cured or hardened by exposure to light, heat, chemical agents, or combinations thereof.

Stage 3 illustrates a state after processing to expose ends 1314 of the conductive posts 1308. For example, one or more grinding operations, one or more polishing operations, or both, may be performed to remove a portion of the polymer layer 1312 (and optionally a portion of the conductive posts 1308) and expose the ends 1314 of the conductive posts 1308.

Stage 4 depicts a state after formation of contacts 1316 on the conductive posts 1308 and removal of the carrier structure 1302 to expose second ends 1318 of the conductive posts 1308. For example, the contacts 1316 can be formed using one or more deposition operations (as guided by a patterned resist layer). Formation of the contacts 1316 is optional and is omitted in some implementations. In FIG. 13, the contacts 1316 are illustrated as conductive pads (e.g., copper pads); however, in other embodiments, the contacts 1316 can include solder bumps in addition to or instead of conductive pads.

In some embodiments, after removal of the carrier structure 1302, additional operations can be performed to prepare the second ends 1318 of the conductive posts 1308 for further processing. For example, the additional operations can include one or more planarization operations (e.g., grinding and/or polishing), one or more cleaning operations, etc.

Stage 5 depicts a state after formation of contacts 1320 on the second ends 1318 of the conductive posts 1308 and after individuation of multiple patch components 1322. In the example illustrated in FIG. 13, each patch component 1322 includes multiple conductive posts 1308 extending through a body 1324 and each conductive post 1308 includes a contact 1316, 1320 at each end. As described above regarding the contacts 1316, the contacts 1320 can include conductive pads or solder bumps.

Formation of the patch components 1322 (including patch component 1322A and patch component 1322B) is complete at Stage 5 of FIG. 13. In FIG. 13, the patch component 1322A includes a body 1324A that includes a polymer and a plurality of conductive posts 1308A extending therethrough. Ends 1314, 1318 of each of the conductive posts 1308A include contacts 1316A, 1320A to prepare the patch component 1322A for electrical connection with a substrate or a logic die. Similarly, the patch component 1322B includes a body 1324B that includes a polymer, a plurality of conductive posts 1308B extending through the body 1324B, and contacts 1316B, 1320B to prepare the patch component 1322B for electrical connection with a substrate or a logic die.

In FIG. 13, two patch components 1322 are illustrated; however, as explained above, wafer-level, strip-level, or panel-level processes can be used to form the patch components 1322, and such processes can concurrently form many more than two (e.g., tens or hundreds) of patch components 1322. Further, as explained with reference to FIG. 12, contacts can be fabricated in various ways, resulting in different end configurations of the conductive posts 1308. For example, each end of each conductive post 1308 can include a solder bump, each end of each conductive post 1308 can include a conductive pad, or one side of the patch component 1322 can include solder bumps and the other side can include conductive pads. Additionally, three conductive posts 1308 per patch component 1322 is merely illustrative, and the patch components 1322 can include more than three conductive posts 1308.

In some embodiments, the body 1324 of a patch component 1322 can include circuitry, such as embedded passive circuit components (e.g., capacitors, inductors, resistors), conductors (e.g., traces) formed between two Stages of FIG. 12 (such as between Stages 1 and 2). In such embodiments, the patch component 1322 can include the circuitry 402 of FIG. 4, the conductive path(s) 602 of FIG. 6, or both.

Exemplary Sequences for Fabricating Stacked IC Devices

Figure 14A:
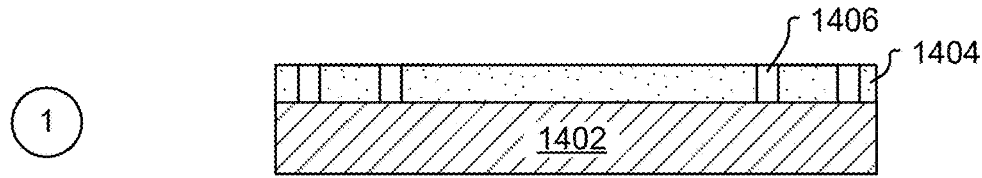
FIG. 14A and FIG. 14B together illustrate an exemplary sequence for fabricating an example of a stacked IC device.
Figure 14A:
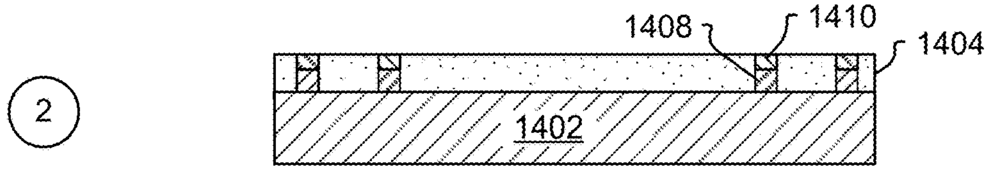
Figure 14A:
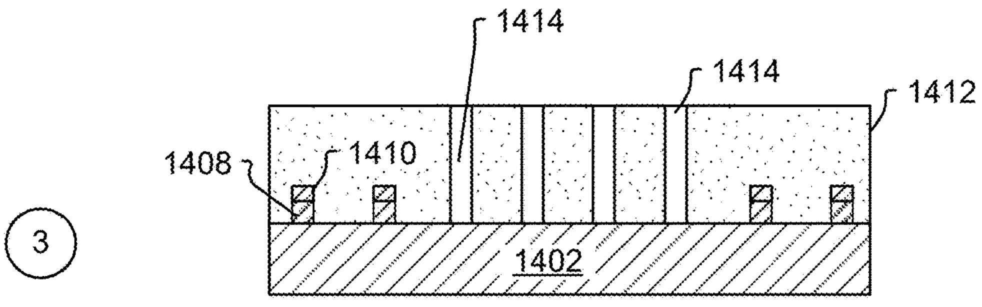
Figure 14A:
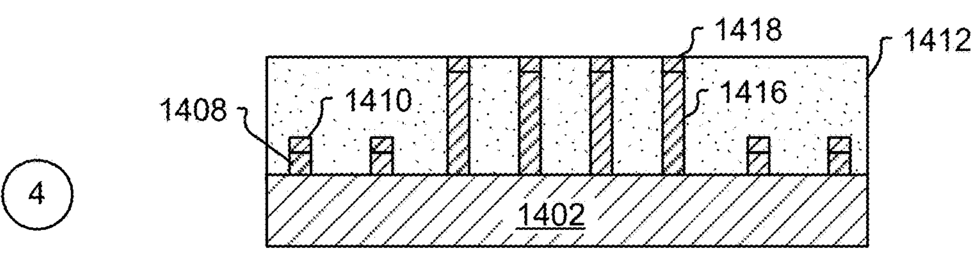
Figure 14B:
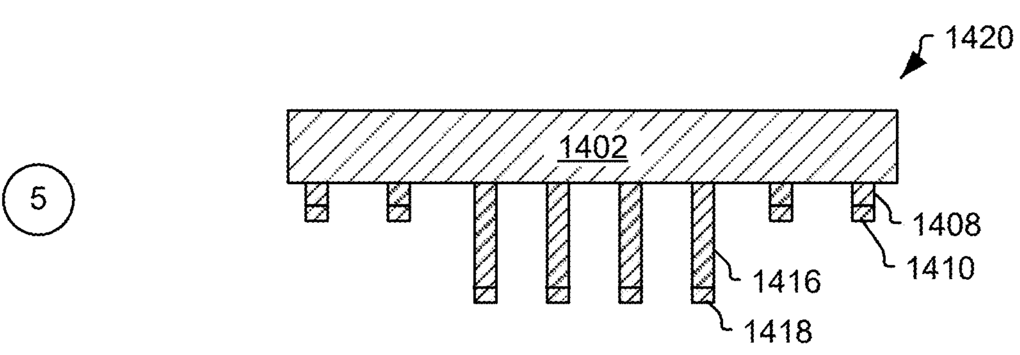
Figure 14B:
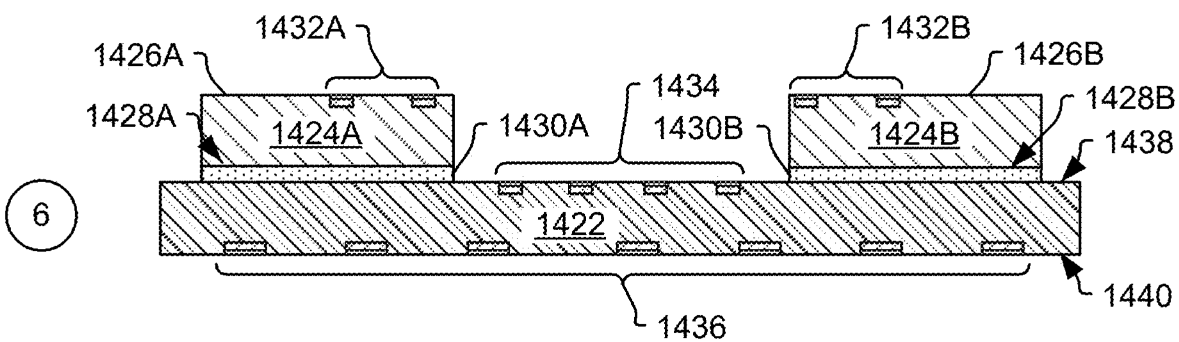
Figure 14B:
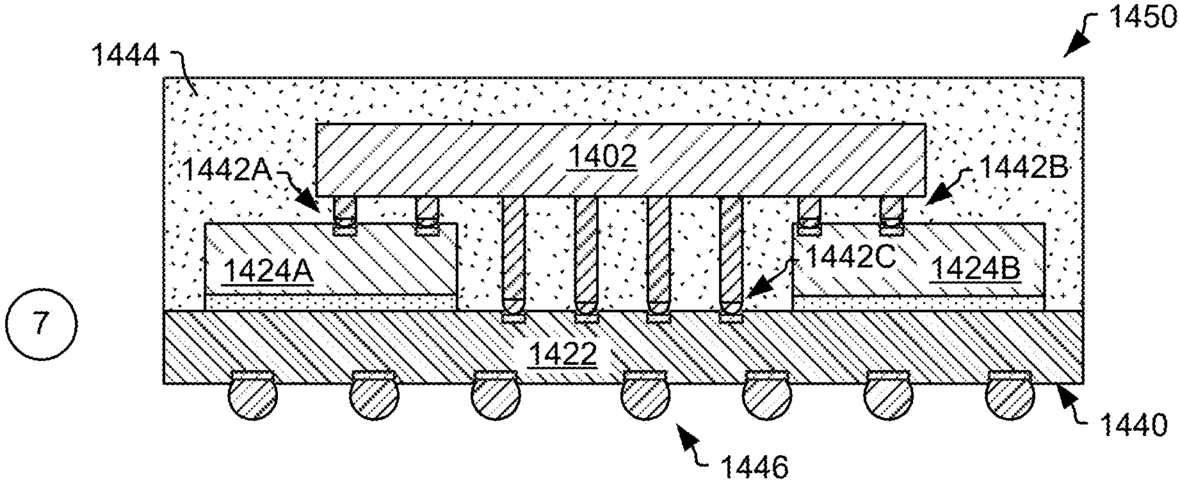

FIGS. 14A and 14B, together, illustrate an exemplary sequence for fabricating a stacked IC device that does not include a patch component. In some implementations, the sequence of FIGS. 14A and 14B may be used to provide (e.g., during fabrication of) any of the stacked IC devices of FIGS. 1A-11 that do not include a patch component, such as particular embodiments of the stacked IC devices 100, 300, 500, 700, 800, 900, 1000, and 1100.

It should be noted that the sequence of FIGS. 14A and 14B may combine two or more stages in order to simplify and/or clarify the sequence for providing or fabricating a stacked IC device. In some examples, the order of the processes may be changed or modified. In some examples, one or more of the processes may be replaced or substituted without departing from the scope of the disclosure. In the following description, reference is made to various illustrative stages of the sequence, which are numbered (using circled numbers) in FIGS. 14A and 14B. Each of the various stages of the sequence illustrated in FIGS. 14A and 14B shows formation of a single stacked IC device; however, one or more of the stages of the sequence can be performed using wafer-level, reconstructed wafer-level, strip-level, or panel-level operations.

FIGS. 14A and 14B depict schematic cross-sectional representations of Stages during formation of a stacked IC device. Stage 1 of FIG. 14A illustrates a state after formation of a patterned resist layer 1404 on a face of a logic die 1402. For example, the logic die 1402 can be joined with one or more other dies as components of a wafer, a reconstituted wafer, a strip, or a panel, and patterned resist layer 1404 can be formed on concurrently on the logic die 1402 and the one or more other dies. To illustrate, one or more spraying, dispensing, or spin-on operations can be used to apply a resin that is subsequently patterned to form the patterned resist layer 1404. Alternatively, a dry-film resist can be applied to the logic die 1402 (and optionally the one or more other dies) and patterned to form the patterned resist layer 1404. The patterned resist layer 1404 defines openings 1406 at locations corresponding to locations of contacts of memory dies to which the logic die 1402 will be attached in the stacked IC device.

Stage 2 illustrates a state after formation of conductors as guided by the patterned resist layer 1404. At Stage 2, each of the conductors includes a conductive post 1408 (e.g. copper post) and a solder cap 1410. The conductors correspond to examples of the interconnects 108 of FIGS. 1A-1C. The conductive posts 1408 and solder caps 1410 can be formed using deposition operations, such as chemical vapor deposition, physical vapor deposition, electroplating, or a combination thereof. The conductive posts 1408 are electrically connected to contacts on the face of the logic die 1402. Alternatively, before Stage 1, one or more RDLs can be formed on the logic die 1402, in which case the conductive posts 1408 are electrically connected to contacts of the RDLs.

Stage 3 of FIG. 14A illustrates a state after removal of the patterned resist layer 1404 and formation of a second patterned resist layer 1412 on the logic die 1402. The second patterned resist layer 1412 can be formed using any of the operations described above with reference to formation of the patterned resist layer 1404. The second patterned resist layer 1412 defines openings 1414 at locations corresponding to locations of contacts of a substrate to which the logic die 1402 will be attached in the stacked IC device.

Stage 4 illustrates a state after formation of conductors as guided by the second patterned resist layer 1412. At Stage 2, each of the conductors includes a conductive post 1416 (e.g. copper post) and a solder cap 1418. The conductors correspond to examples of the conductors 10 of FIGS. 1A-1C. The conductive posts 1416 and solder caps 1418 can be formed using deposition operations, such as chemical vapor deposition, physical vapor deposition, electroplating, or a combination thereof. The conductive posts 1416 are electrically connected to contacts on the face of the logic die 1402. Alternatively, before Stage 1, one or more RDLs can be formed on the logic die 1402, in which case the conductive posts 1416 are electrically connected to contacts of the RDLs.

Stage 5 of FIG. 14B illustrates a state after removal of the second patterned resist layer 1412, leaving a device 1420. The device 1420 includes the logic die 1402 and conductors with different characteristic dimensions attached in a flip-chip configuration. If the operations described with reference to Stages 1-4 are performed on multiple logic dies that are joined together, e.g., as part of a wafer, reconstructed wafer, strip, or panel, the state illustrated at Stage 5 is also after individuation of the logic dies.

Stage 6 illustrates a state after formation of a substrate 1422 (e.g., a package substrate of the stacked IC device being formed) and attachment of memory dies 1424 to a top surface 1438 of the substrate 1422. The substrate 1422 includes multiple metal layers separated from one another by dielectric layers. The metal layers are patterned to define traces and are selectively interconnected by vias that define conductive paths between on-package contacts 1434 on the top surface 1438 of the substrate 1422 and off-package contacts 1436 on a bottom surface 1440 of the substrate 1422. The substrate 1422 optionally includes other features, such as capacitive devices, on the top surface 1438, on the bottom surface 1440, or embedded in the substrate 1422 and electrically connected to one or more of the on-package contacts 1434, to one or more of the off-package contacts 1436, or both.

In FIG. 14B, the memory dies 1424, including a memory die 1424A and a memory die 1424B, are coupled to the substrate 1422 in face-up orientations. For example, the memory die 1424A includes a face 1426A and a back 1428A, and the back 1428A of the memory die 1424A is coupled to the top surface 1438 of the substrate using an adhesive layer 1430A. Likewise, the memory die 1424B includes a face 1426B and a back 1428B, and the back 1428B of the memory die 1424B is coupled to the top surface 1438 of the substrate using an adhesive layer 1430B. Accordingly, contacts 1432A and contacts 1432B of the memory dies 1424 are oriented away from the substrate 1422 (e.g., facing the same direction as the on-package contacts 1434 of the substrate 1422).

Stage 7 illustrates a state after formation of electrical connections 1442A between the logic die 1402 and the memory die 1424A, formation of electrical connections 1442B between the logic die 1402 and the memory die 1424B, and formation of electrical connections 1442C between the logic die 1402 and the substrate 1422 in a region between the memory die 1424A and the memory die 1424B. For example, one or more die attach operations, such as alignment and solder reflow, can be used to attach the device 1420 to the substrate 1422 and the memory dies 1424.

Optionally, one or more molding operations can be performed after the electrical connections 1442 are formed to at least partially encapsulate the memory dies 1424, the electrical connections 1442C, the logic dies 1402, or a combination thereof, in mold compound 1444.

The state illustrated at Stage 7 also follows formation of solder balls or solder bumps 1446 on the off-package contacts 1436 to facilitate formation of electrical connections between the substrate 1422, the logic die 1402, the memory dies 1424, or combinations thereof, to one or more off-package devices.

Formation of a stacked IC device 1450 is complete at Stage 7 of FIG. 14B. For example, the stacked IC device 1450 includes a first memory die (e.g., the memory die 1424A) coupled to a substrate (e.g., the substrate 1422), a second memory die (e.g., the memory die 1424B) coupled to the substrate, and a logic die electrically connected face-to-face to the first memory die and face-to-face to the second memory die and electrically connected to the substrate by conductors (e.g., the conductive posts 1416 and solder caps 1418) that extend through a region between the first memory die and the second memory die.

In FIG. 14B, two memory dies 1424 and one logic die 1402 are illustrated; however, the operations described with reference to Stages 1-7 of FIGS. 14A and 14B can be used to form a stacked IC device that includes more than two memory dies 1424, more than one logic die 1402, or both. For example, the operations described with reference to Stages 1-7 of FIGS. 14A and 14B can be used to form embodiments of the stacked IC devices 500, 600, 1000, or 1100 that do not include a patch component.

Optionally, in some embodiments, the memory dies 1424 include additional contacts that are electrically connected, via wire bonding, to additional on-package contacts on the top surface 1428 of the substrate 1422. In such embodiments, wire bonding operations to electrically connect the additional contacts of the memory dies 1424 to additional on-package contacts can be performed after Stage 6 and before molding operations. Such embodiments can be used to fabricate embodiments of the stacked IC device 800 of FIG. 8 that do not include a patch component.

Optionally, in some embodiments, one or more additional memory dies can be attached to the faces of the memory dies 1424 and electrically connected, via wire bonding, to additional on-package contacts on the top surface 1428 of the substrate 1422. In such embodiments, the additional memory die(s) can be attached to the faces of the memory dies 1424 at Stage 6 or after Stage 6, and wire bonding operations to electrically connect the additional memory dies to additional on-package contacts can be performed after Stage 6 and before molding operations. Such embodiments can be used to fabricate embodiments of the stacked IC device 900 of FIG. 9 that do not include a patch component.

Figure 15:
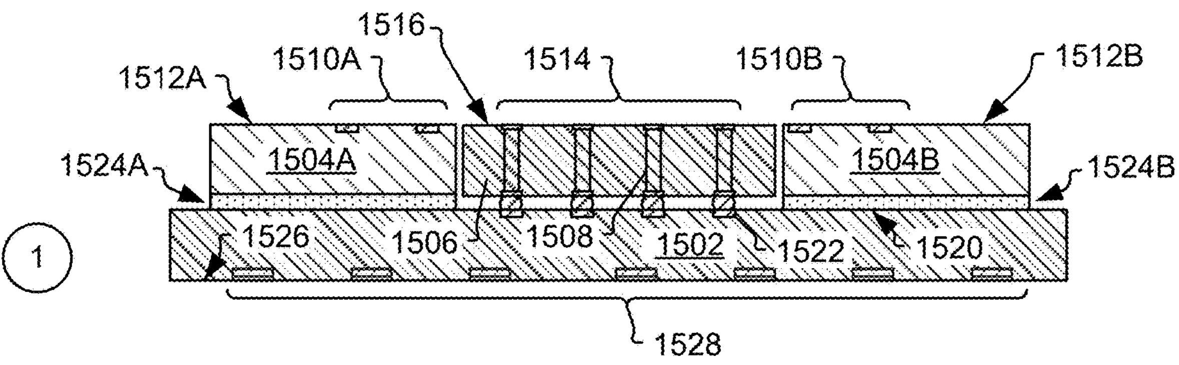
FIG. 15 illustrates an exemplary sequence for fabricating another example of a stacked IC device.
Figure 15:
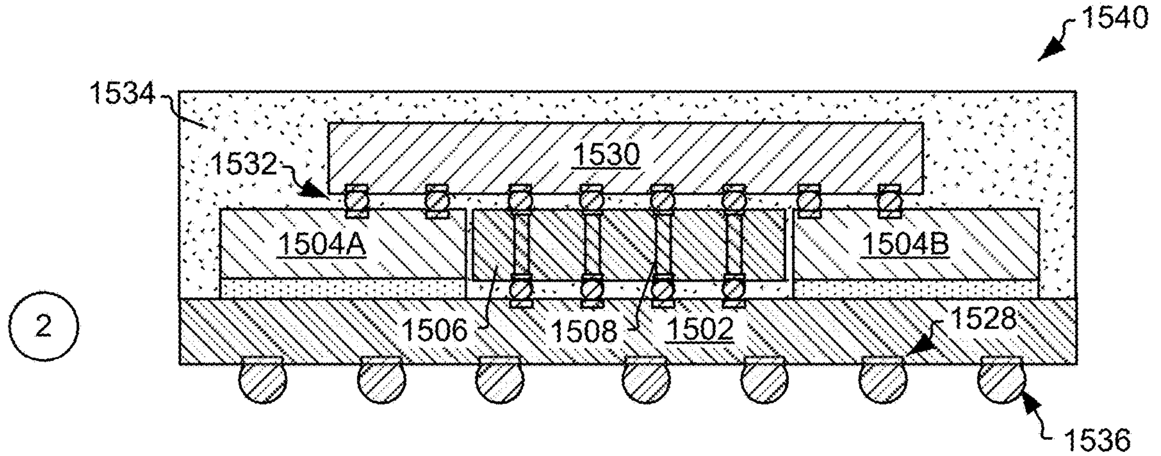

FIG. 15 illustrates an exemplary sequence for fabricating a stacked IC device that includes a patch component. In some implementations, the sequence of FIG. 15 may be used to provide (e.g., during fabrication of) any of the stacked IC devices of FIGS. 1A-11 that include a patch component, such as particular embodiments of the stacked IC devices 100, 200, 300, 400, 500, 600, 700, 800, 900, 1000, or 1100.

It should be noted that the sequence of FIG. 15 may combine two or more stages in order to simplify and/or clarify the sequence for providing or fabricating a stacked IC device. In some examples, the order of the processes may be changed or modified. In some examples, one or more of the processes may be replaced or substituted without departing from the scope of the disclosure. In the following description, reference is made to various illustrative stages of the sequence, which are numbered (using circled numbers) in FIG. 15. Each of the various stages of the sequence illustrated in FIG. 15 shows formation of a single stacked IC device; however, one or more of the stages of the sequence can be performed using wafer-level, reconstructed wafer-level, strip-level, or panel-level operations.

FIG. 15 depicts schematic cross-sectional representations of Stages during formation of a stacked IC device. Stage 1 illustrates a state after a patch component 1506 and memory dies 1504 (including a memory die 1504A and a memory die 1504B) are coupled to a substrate 1502. The patch component 1506 includes conductors 1508 that extend through a body of the patch component 1506. For example, the patch component 1506 can include or correspond to the patch component 202 of any of FIGS. 2-9, one of the patch components 1220 of FIG. 12, or one of the patch components 1322 of FIG. 13.

The memory dies 1504 are coupled to the substrate 1502 in a face-up orientation in FIG. 15. For example, a back of the memory die 1504A is coupled to the substrate 1502 by a bond layer 1524A, and a face 1512A of the memory die 1504A is oriented away from the substrate 1502 such that contacts 1510A on the face 1512A of the memory die 1504A are exposed at Stage 1. Likewise, a back of the memory die 1504B is coupled to the substrate 1502 by a bond layer 1524B, and a face 1512B of the memory die 1504B is oriented away from the substrate 1502 such that contacts 1510B on the face 1512B of the memory die 1504B are exposed at Stage 1.

First ends of the conductors 1508 of the patch component 1506 are electrically connected to on-package contacts 1522 on a top side 1520 of the substrate 1502, and second ends 1514 of the conductors 1508 of the patch component 1506 are exposed at Stage 1. For example, after the patch component 1506 is positioned on the substrate 1502, one or more reflow operations may be performed to form electrical connections between the conductors 1508 and the on-package contacts 1522 of the substrate 1502. In the example shown in FIG. 15, the ends of the conductors 1508 are illustrated as conductive pads; however, as described above, contacts at the ends of the conductors 1508 can include conductive pads or solder bumps.

The patch component 1506 and the memory dies 1504 are coupled to the substrate 1502 such that a top surface 1516 of the patch component 1506 is substantially co-planar with the faces 1512 of the memory dies 1504. In a particular example, the memory dies 1504 are coupled to the substrate 1502 after the patch component 1506 is attached and electrically connected to the substrate 1502. In this example, the positions of the faces 1512 of the memory dies 1504 can be compared to the top surface 1516 of the patch component 1506 to arrange the faces 1512 of the memory dies 1504 to be substantially co-planar with the top surface 1516 of the patch component 1506.

In addition to the on-package contacts 1522, the substrate 1502 includes off-package contacts 1528 on a bottom side 1526 of the substrate 1502. Various ones of the on-package contacts 1522 are electrically connected to corresponding ones of the off-package contacts 1528 by conductors within the substrate 1502. In addition, the substrate 1502 can include other features, such as capacitive devices, on the top side 1520, on the bottom side 1526, or embedded in one or more layers between the top and bottom sides 1520, 1526.

Stage 2 illustrates a state after a logic die 1530 is electrically connected to the patch component 1506 and electrically connected face-to-face to each of the memory dies 1504 by interconnects 1532. For example, one or more die attach operations, such as alignment and solder reflow, can be used to attach the logic die 1530 to the substrate patch component 1506 and to the memory dies 1504.

In some examples, fabrication of a stacked IC device 1540 is complete after the logic die 1530 is electrically connected to the patch component 1506 and electrically connected face-to-face to each of the memory dies 1504. For example, the stacked IC device 1540 includes a first memory die (e.g., the memory die 1504A) coupled to a substrate (e.g., the substrate 1502), a second memory die (e.g., the memory die 1504B) coupled to the substrate, and a logic die (e.g., logic die 1530) electrically connected face-to-face to the first memory die and face-to-face to the second memory die, and the logic die electrically connected to the substrate by conductors (e.g., the conductors 1508) that extend through a region between the first memory die and the second memory die.

In the example illustrated in FIG. 15, additional operations have been performed. For example, the memory dies 1504, the patch component 1506, the logic die 1530, or a combination thereof, have been at least partially encapsulated in mold compound 1534. Additionally, in FIG. 15, solder balls 1536 have been attached to the off-package contacts 1528. The addition of solder balls 1536 and encapsulation with the mold compound 1534 are optional and are omitted in some embodiments.

In FIG. 15, two memory dies 1504 and one logic die 1530 are illustrated; however, the operations described with reference to Stages 1 and 2 of FIG. 15 can be used to form a stacked IC device that includes more than two memory dies 1504, more than one logic die 1530, or both. For example, the operations described with reference to FIG. 15 can be used to form embodiments of the stacked IC devices 500, 600, 1000, or 1100 that do include a patch component.

Optionally, in some embodiments, the memory dies 1504 include additional contacts that are electrically connected, via wire bonding, to additional on-package contacts on the top side 1520 of the substrate 1502. In such embodiment, wire bonding operations to electrically connect the additional contacts of the memory dies 1504 to additional on-package contacts can be performed after Stage 1 and before the molding operations of Stage 2. Such embodiments can be used to fabricate embodiments of the stacked IC device 800 of FIG. 8 that include a patch component.

Optionally, in some embodiments, one or more additional memory dies can be attached to the faces 1512 of the memory dies 1504 and electrically connected, via wire bonding, to additional on-package contacts on the top surface 1428 of the substrate 1422. In such embodiment, the additional memory die(s) can be attached to the faces 1512 of the memory dies 1504 after the die attach operations to attach the logic die 1530 to the memory dies 1504 and the patch component 1506. Wire bonding operations to electrically connect the additional memory dies to additional on-package contacts can be performed before the molding operations of Stage 2. Such embodiments can be used to fabricate embodiments of the stacked IC device 900 of FIG. 9 that do include a patch component.

Exemplary Flow Diagrams of Methods for Fabricating Stacked IC Devices

Figure 16:
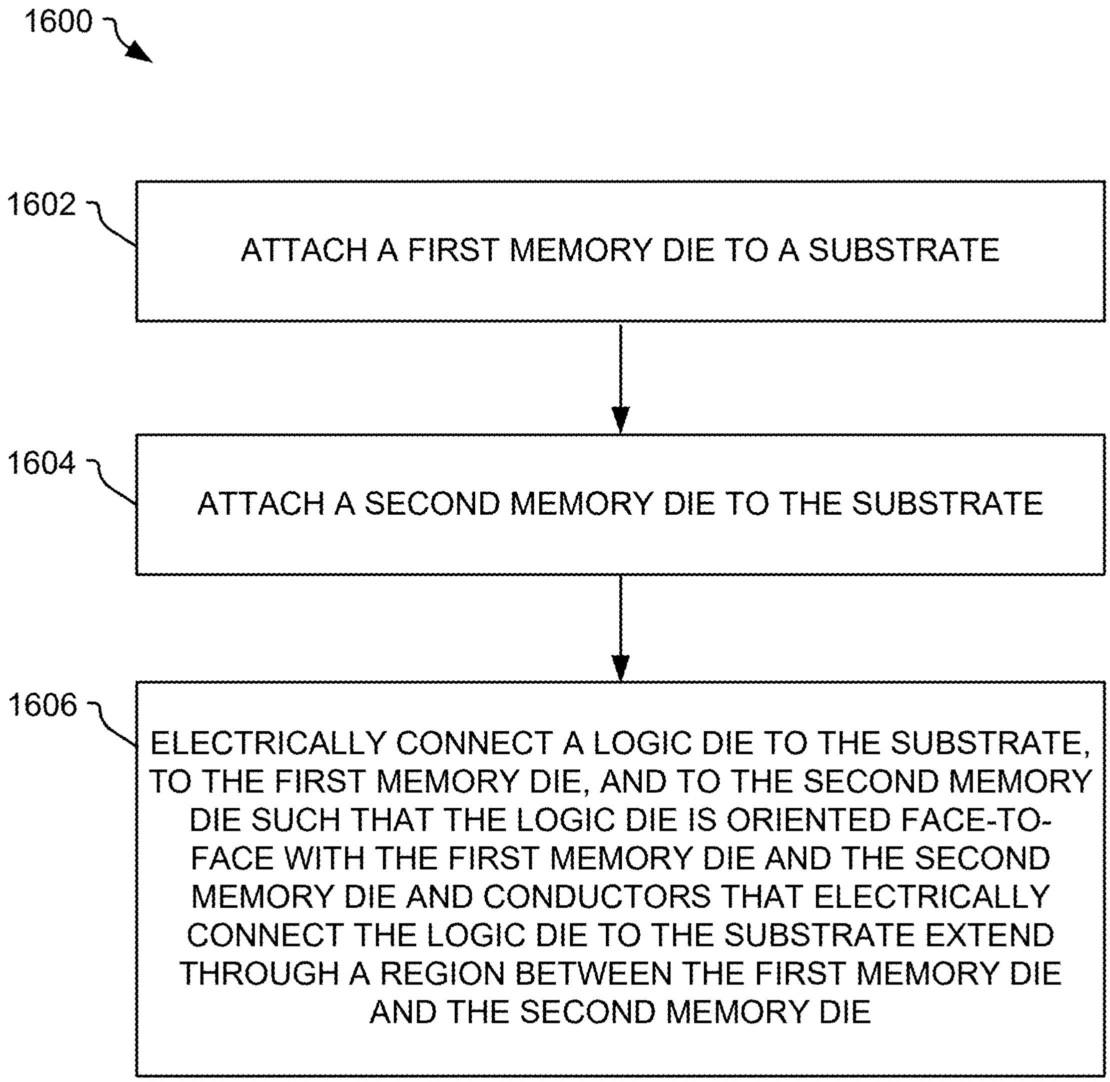
FIG. 16 illustrates an exemplary flow diagram of a method for fabricating an exemplary stacked IC device.

In some implementations, fabricating a stacked IC device includes several processes. FIG. 16 illustrates an exemplary flow diagram of a method 1600 for providing or fabricating a stacked IC device. In some implementations, the method 1600 of FIG. 16 can be used to provide or fabricate any of the stacked IC devices of FIG. 1A-15. It should be noted that the method 1600 may combine one or more processes in order to simplify and/or clarify the method 1600 for providing or fabricating a stacked IC device. In some implementations, the order of the processes may be changed or modified.

The method 1600 includes, at block 1602, attaching a first memory die to a substrate, and, at block 1604, attaching a second memory die to the substrate. For example, the memory dies 1424 can be attached to the substrate 1422 as described with reference to Stage 6 of FIG. 14B. As another example, the memory dies 1504 can be attached to the substrate 1502 as described with reference to Stage 1 of FIG. 15. The memory dies can include any of the memory dies 104 of FIGS. 1A-11, and the substrate can include the substrate 102 of any of FIGS. 1A-11.

The method 1600 includes, at block 1606, electrically connecting a logic die to the substrate, the first memory die, and the second memory die such that the logic die is oriented face-to-face with the first memory die and the second memory die and conductors that electrically connect the logic die to the substrate extend through a region between the first memory die and the second memory die. For example, the conductors can be coupled to the logic die in a flip-chip arrangement, as described with reference to FIGS. 14A and 14B. To illustrate, the conductors can include the conductive posts 1416 and solder caps 1418 of the device 1420 of FIG. 14B. In this example, the flip-chip die attach operations can be used to electrically connect the logic die 1402 to the substrate 1422, as described with reference to Stage 6 of FIG. 14B.

In another example, the conductors can be at least partially incorporated within a body of a patch component. In this example, the conductors of the patch component can be electrically connected to the substrate, and the logic die can be electrically connected to the conductors, as described with reference to FIG. 15. The patch component can include any of the patch components 202 of FIGS. 2-9, the patch component 1220 of FIG. 12, the patch component 1322 of FIG. 13, or the patch component 1506 of FIG. 15.

In some embodiment, the method 1600 also includes connecting contacts on a face of at least one of the memory dies to contacts of the substrate through wire bonds. For example, the memory dies 104 of FIG. 8 include contacts 804 that are electrically connected to contacts 808 of the substrate 102 by wire bonds 806.

In some embodiment, the method 1600 also includes attaching one or more additional memory dies to at least one of the memory dies in a stacked configuration and electrically connecting contacts on face of the additional memory die(s) to contacts of the substrate through wire bonds. For example, the additional memory dies 904 are stacked, face-to-back, on faces 116 of memory dies 104 of FIG. 9. The additional memory dies 904 include contacts 912 that are electrically connected to contacts 916 of the substrate 102 by wire bonds 914.

In some embodiments, the method 1600 also includes electrically connecting a second logic die to the logic die by one or more conductive paths through the conductors. For example, the logic dies 110A and 110B of FIGS. 5 and 6 can be electrically connected by conductive paths 502, 602, or both, through the conductors 106.

Exemplary Electronic Devices

Figure 17:
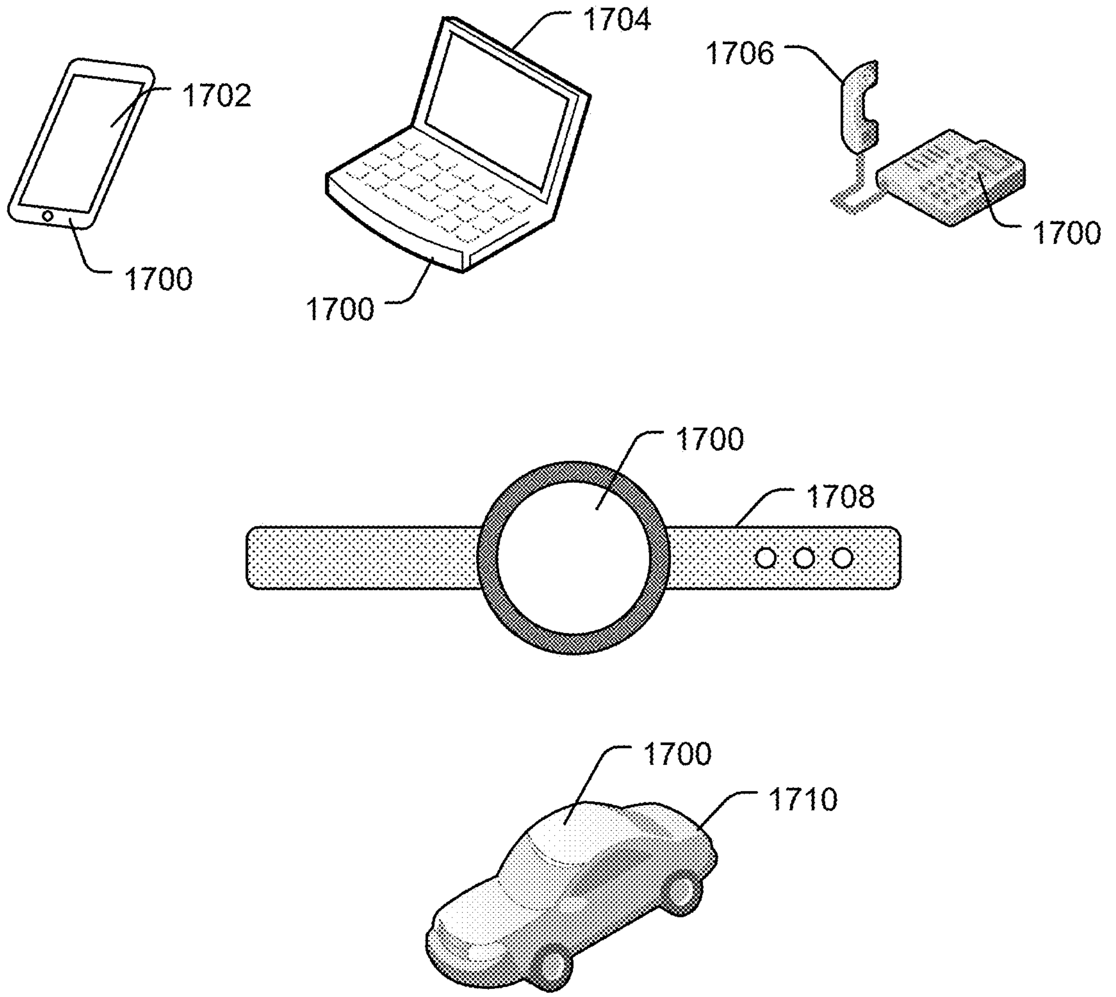
FIG. 17 illustrates various electronic devices that may integrate a die, a stacked IC device, an electronic circuit, an integrated device, a package, and/or a device package described herein.

FIG. 17 illustrates various electronic devices that may include or be integrated with any of the stacked IC devices 100, 200, 300, 400, 500, 600, 700, 800, 900, 1000, 1100, 1450, 1540 of any of FIG. 1A-11, 14, or 15. For example, a mobile phone device 1702, a laptop computer device 1704, a fixed location terminal device 1706, a wearable device 1708, or a vehicle 1710 (e.g., an automobile or an aerial device) may include a device 1700. The device 1700 can include, for example, any of the stacked IC devices 100, 200, 300, 400, 500, 600, 700, 800, 900, 1000, 1100, 1450, 1540 of any of FIG. 1A-11, 14, or 15. The devices 1702, 1704, 1706, 1708 and the vehicle 1710 illustrated in FIG. 17 are merely exemplary. Other electronic devices may also feature the device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-17 may be rearranged and/or combined into a single component, process, feature, or function or embodied in several components, processes, or functions. Additional elements, components, processes, and/or functions may also be added without departing from the disclosure. It should also be noted FIGS. 1-17 and their corresponding description in the present disclosure is not limited to dies and/or ICs. In some implementations, FIGS. 1-17 and their corresponding description may be used to manufacture, create, provide, and/or produce devices and/or integrated devices. In some implementations, a device may include a die, an integrated device, an integrated passive device (IPD), a die package, an IC device, a device package, an IC package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, and/or integrated circuits. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" and "electrically connected" may mean that two objects are directly or indirectly coupled together such that an electrical current (e.g., signal, power, ground) may travel between the two objects. Two objects that are electrically coupled may or may not have an electrical current traveling between the two objects. The use of the terms "first," "second," "third," and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate," "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, a reflow process, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a stacked integrated circuit (IC) device includes a first memory die coupled to a substrate; a second memory die coupled to the substrate; a logic die electrically connected, face-to-face, to the first memory die and the second memory die and electrically connected to the substrate by conductors that extend through a region between the first memory die and the second memory die.

Example 2 includes the stacked IC device of Example 1 and further includes a plurality of electrical interconnects on a face of the logic die, the plurality of electrical interconnects including: first electrical interconnects in a first memory interconnect region, wherein the first electrical interconnects have a first characteristic length; second electrical interconnects in a second memory interconnect region, wherein the second electrical interconnects have the first characteristic length; and the conductors, wherein the conductors have a second characteristic length greater than the first characteristic length.

Example 3 includes the stacked IC device of Example 1 or Example 2 and further includes a patch component coupled to the substrate, wherein the conductors are located in a body of the patch component.

Example 4 includes the stacked IC device of Example 3, wherein the body includes a polymer in which the conductors are embedded.

Example 5 includes the stacked IC device of Example 3, wherein the body includes silicon, and the conductors include through silicon vias.

Example 6 includes the stacked IC device of any of Examples 3 to 5, wherein the patch component includes active circuit components, passive circuit components, or both.

Example 7 includes the stacked IC device of any of Examples 3 to 6, wherein a face of the first memory die is substantially coplanar with a face of the patch component.

Example 8 includes the stacked IC device of any of Examples 3 to 7, wherein the first memory die, the second memory die, the logic die, the patch component, or combinations thereof, are at least partially encapsulated in mold compound.

Example 9 includes the stacked IC device of any of Examples 3 to 8 and further includes a second logic die electrically connected to the logic die by one or more conductive paths through the patch component.

Example 10 includes the stacked IC device of any of Examples 1 to 9 and further includes one or more redistribution layers coupled to the logic die, wherein electrical connections of the logic die to the first memory die and to the second memory die include conductive paths in the one or more redistribution layers.

Example 11 includes the stacked IC device of any of Examples 1 to 10 and further includes wire bonds electrically connecting contacts on a face of the first memory die to contacts of the substrate.

Example 12 includes the stacked IC device of any of Examples 1 to 10 and further includes a third memory die coupled in a stacked configuration to the first memory die, and a plurality of wire bonds electrically connecting contacts on a face of the third memory die to contacts of the substrate.

Example 13 includes the stacked IC device of any of Examples 1 to 12, wherein the first memory die is coupled to a recess in the substrate.

According to Example 14, a stacked IC device includes a first memory die coupled to a substrate; a second memory die coupled to the substrate; a first logic die electrically connected, face-to-face, to the first memory die; a second logic die electrically connected, face-to-face, to the second memory die; and conductors extending through a region between the first memory die and the second memory die and electrically connecting the first logic die and the second logic die to the substrate.

Example 15 includes the stacked IC device of Example 14, and further includes a patch component coupled to the substrate, wherein the conductors are located in a body of the patch component.

Example 16 includes the stacked IC device of Example 15, wherein the first logic die and the second logic die are electrically connected to one another by one or more conductive paths through the patch component.

Example 17 includes the stacked IC device of Example 15 or Example 16, wherein the conductors include through mold vias.

Example 18 includes the stacked IC device of Example 15 or Example 16, wherein the conductors include through silicon vias.

Example 19 includes the stacked IC device of any of Examples 15 to 18, wherein the patch component includes active circuit components, passive circuit components, or both.

Example 21 includes the stacked IC device of any of Examples 14 to 19 and further includes wire bonds electrically connecting contacts on a face of the first memory die to contacts of the substrate.

Example 22 includes the stacked IC device of any of Examples 14 to 19 and further includes a third memory die coupled in a stacked configuration to the first memory die, and a plurality of wire bonds electrically connecting contacts on a face of the third memory die to contacts of the substrate.

Example 23 includes the stacked IC device of any of Examples 14 to 22, wherein the first memory die is coupled to a recess in the substrate.

According to Example 24, a method includes attaching a first memory die to a substrate; attaching a second memory die to the substrate; and electrically connecting a logic die to the substrate, the first memory die, and the second memory die such that the logic die is oriented face-to-face with the first memory die and the second memory die and conductors that electrically connect the logic die to the substrate extend through a region between the first memory die and the second memory die.

Example 25 includes the method of Example 24, wherein the conductors are disposed in a body of a patch component, and wherein electrically connecting the logic die to the substrate comprises: electrically connecting the patch component to the substrate in the region between the first memory die and the second memory die; and electrically connecting the logic die to the patch component.

Example 26 includes the method of Example 24 or Example 25 and further includes electrically connecting contacts on a face of the first memory die to contacts of the substrate through wire bonds.

Example 27 includes the method of Example 24 or Example 25 and further includes attaching a third memory die to the first memory die in a stacked configuration; and electrically connecting contacts on a face of the third memory die to contacts of the substrate through wire bonds.

Example 28 includes the method of any of Examples 24 to 27 and further includes electrically connecting a second logic die to the substrate and, face-to-face, to the first memory die.

Example 29 includes the method of Example 28 and further includes electrically connecting the second logic die to the logic die by one or more conductive paths through the conductors.

The invention claimed is:

1. A stacked integrated circuit (IC) device comprising:
- a first memory die coupled to a substrate;
- a second memory die coupled to the substrate;
- a logic die electrically connected, face-to-face, to the first memory die and the second memory die and electrically connected to the substrate by conductors that extend through a region between the first memory die and the second memory die; and
- wire bonds electrically connecting contacts on a face of the first memory die to contacts of the substrate.

2. The stacked IC device of claim 1, further comprising a plurality of electrical interconnects on a face of the logic die, the plurality of electrical interconnects including:
- first electrical interconnects in a first memory interconnect region, wherein the first electrical interconnects have a first characteristic length;
- second electrical interconnects in a second memory interconnect region, wherein the second electrical interconnects have the first characteristic length; and
- the conductors, wherein the conductors have a second characteristic length greater than the first characteristic length.

3. The stacked IC device of claim 1, further comprising a patch component coupled to the substrate, wherein the conductors are located in a body of the patch component.

4. The stacked IC device of claim 3, wherein the body includes a polymer in which the conductors are embedded.

5. The stacked IC device of claim 3, wherein the body includes silicon, and the conductors include through silicon vias.

6. The stacked IC device of claim 3, wherein the patch component includes active circuit components, passive circuit components, or both.

7. The stacked IC device of claim 3, wherein a face of the first memory die is substantially coplanar with a face of the patch component.

8. The stacked IC device of claim 3, wherein the first memory die, the second memory die, the logic die, the patch component, or combinations thereof, are at least partially encapsulated in mold compound.

9. The stacked IC device of claim 3, further comprising a second logic die electrically connected to the logic die by one or more conductive paths through the patch component.

10. The stacked IC device of claim 1, further comprising one or more redistribution layers coupled to the logic die, wherein electrical connections of the logic die to the first memory die and to the second memory die include conductive paths in the one or more redistribution layers.

11. The stacked IC device of claim 1, further comprising a third memory die coupled in a stacked configuration to the first memory die, and a plurality of wire bonds electrically connecting contacts on a face of the third memory die to contacts of the substrate.

12. The stacked IC device of claim 1, wherein the first memory die is coupled to a recess in the substrate.

13. A stacked IC device comprising:
- a first memory die coupled to a substrate;
- a second memory die coupled to the substrate;
- a first logic die electrically connected, face-to-face, to the first memory die;
- a second logic die electrically connected, face-to-face, to the second memory die;
- conductors extending through a region between the first memory die and the second memory die and electrically connecting the first logic die and the second logic die to the substrate; and
- wherein the first memory die is coupled to a recess in the substrate.

14. The stacked IC device of claim 13, further comprising a patch component coupled to the substrate, wherein the conductors are located in a body of the patch component.

15. The stacked IC device of claim 14, wherein the first logic die and the second logic die are electrically connected to one another by one or more conductive paths through the patch component.

16. A method comprising:
- attaching a first memory die to a substrate;
- attaching a second memory die to the substrate;
- electrically connecting a logic die to the substrate, to the first memory die, and to the second memory die such that the logic die is oriented face-to-face with the first memory die and the second memory die and conductors that electrically connect the logic die to the substrate extend through a region between the first memory die and the second memory die; and
- electrically connecting contacts on a face of the first memory die to contacts of the substrate with wire bonds.

17. The method of claim 16, wherein the conductors are disposed in a body of a patch component, and wherein electrically connecting the logic die to the substrate comprises:

electrically connecting the patch component to the substrate in the region between the first memory die and the second memory die; and electrically connecting the logic die to the patch component.

18. The method of claim 16, further comprising:

electrically connecting a second logic die to the substrate and, face-to-face, to the first memory die; and electrically connecting the second logic die to the logic die by one or more conductive paths through the conductors.

* * * * *